(12) United States Patent
Lee et al.

(10) Patent No.: US 11,887,653 B2
(45) Date of Patent: Jan. 30, 2024

(54) MEMORY DEVICES

(71) Applicant: Samsung Electronics Co., Ltd., Suwon-si (KR)

(72) Inventors: Minsu Lee, Seongnam-si (KR); Min Tae Ryu, Hwaseong-si (KR); Wonsok Lee, Suwon-si (KR); Min Hee Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 82 days.

(21) Appl. No.: 17/705,915

(22) Filed: Mar. 28, 2022

(65) Prior Publication Data

US 2022/0319575 A1    Oct. 6, 2022

(30) Foreign Application Priority Data

Apr. 5, 2021 (KR) .................. 10-2021-0044200

(51) Int. Cl.
  *G11C 11/418* (2006.01)
  *G11C 11/408* (2006.01)
  *H10B 12/00* (2023.01)

(52) U.S. Cl.
  CPC ...... *G11C 11/4085* (2013.01); *G11C 11/4087* (2013.01); *H10B 12/315* (2023.02)

(58) Field of Classification Search
  CPC .................................................. G11C 11/418
  See application file for complete search history.

(56) References Cited

U.S. PATENT DOCUMENTS

| | | | |
|---|---|---|---|
| 7,359,280 B2 | 4/2008 | Chang et al. | |
| 8,000,123 B2 | 8/2011 | Okahiro et al. | |
| 8,050,073 B2 | 11/2011 | Lee | |
| 9,189,384 B2 | 11/2015 | Joo et al. | |
| 9,595,351 B2 | 3/2017 | Choi | |
| 10,706,902 B2 | 7/2020 | Ishii | |
| 2002/0163843 A1 | 11/2002 | Sim et al. | |
| 2013/0087842 A1 | 4/2013 | Kim et al. | |
| 2019/0189186 A1 | 6/2019 | Won et al. | |
| 2020/0183791 A1* | 6/2020 | Park | G06F 11/1458 |

FOREIGN PATENT DOCUMENTS

KR    100510483 B1    8/2005

* cited by examiner

*Primary Examiner* — Jason Lappas
(74) *Attorney, Agent, or Firm* — Myers Bigel, P.A.

(57) ABSTRACT

Disclosed is a memory device including a row decoder generating word line (WL) control signals based on a row address from an external device, a first sub-array including memory cells connected to word lines, a first sub-word line driver (SWD) providing a selection voltage or a non-selection voltage to odd-numbered word lines of the word lines based on odd-numbered WL control signals corresponding to the odd-numbered word lines, and a second SWD providing the selection voltage or the non-selection voltage to even-numbered word lines of the word lines based on even-numbered WL control signals corresponding to the even-numbered word lines. The first SWD applies the non-selection voltage to non-selection word lines of the even-numbered word lines, in response to the even-numbered WL control signals, and the second SWD applies the non-selection voltage to non-selection word lines of the odd-numbered word lines, in response to the odd-numbered WL control signals.

20 Claims, 18 Drawing Sheets

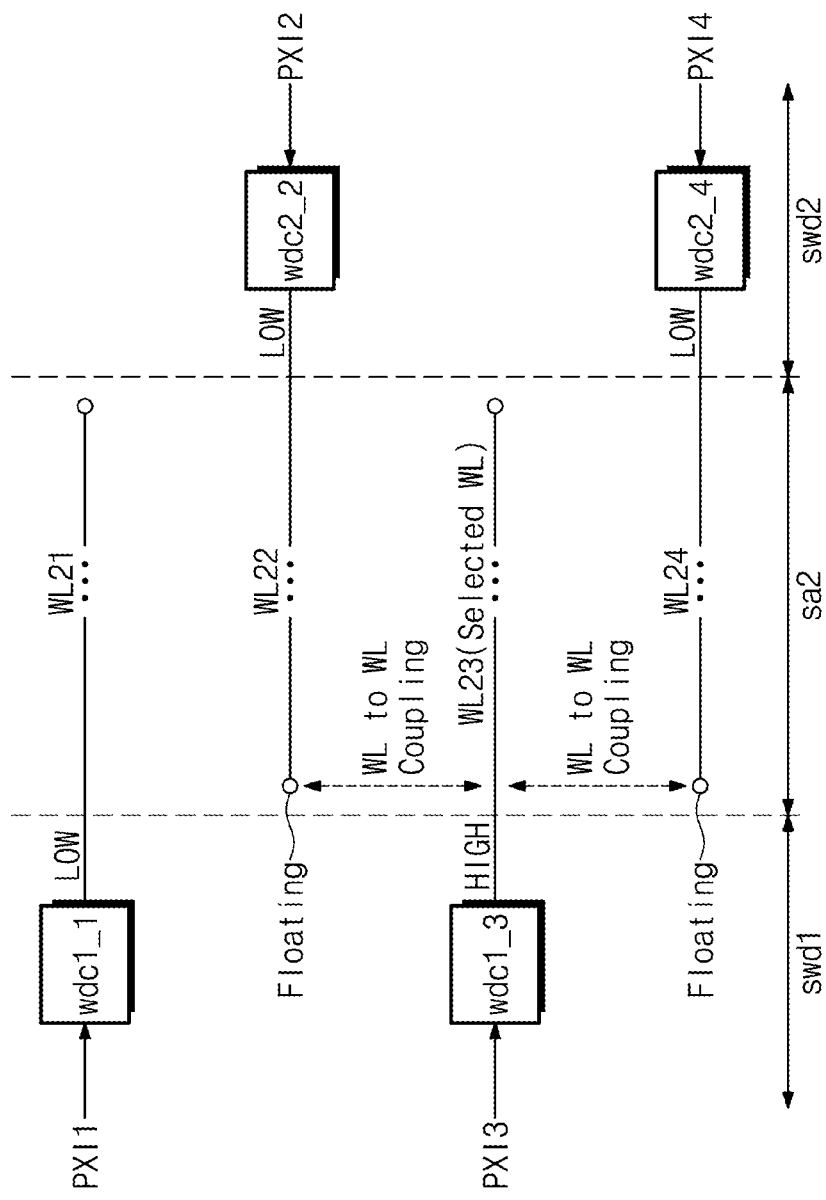

MEMORY DEVICES

CROSS-REFERENCE TO RELATED APPLICATION(S)

This application claims priority under 35 U.S.C. § 119 to Korean Patent Application No. 10-2021-0044200, filed on Apr. 5, 2021, in the Korean Intellectual Property Office, the disclosure of which is incorporated by reference herein in its entirety.

BACKGROUND

The present disclosure relates to memory devices. A semiconductor memory device may be classified as a volatile memory device, in which stored data disappear when a power supply is interrupted, such as a static random access memory (SRAM) or a dynamic random access memory (DRAM), or a nonvolatile memory device, in which stored data are retained even when a power supply is interrupted, such as a flash memory device, a phase-change RAM (PRAM), a magnetic RAM (MRAM), a resistive RAM (RRAM), or a ferroelectric RAM (FRAM).

A DRAM device includes memory cells connected with a word line and a bit line. In a read operation or a write operation of the DRAM device, a selected word line is enabled when a high voltage is applied to the selected word line. In this case, word lines (i.e., unselected word lines) adjacent to the selected word line maintain a low voltage. However, noise caused by coupling between the selected word line and the adjacent word lines may be introduced into the adjacent word line, thereby reducing the reliability of the DRAM device.

SUMMARY

Embodiments of the present disclosure provide a memory device with improved reliability by reducing/preventing noise caused by the coupling between word lines.

According to an embodiment, a memory device includes a row decoder that generates a plurality of word line control signals, based on a row address received from an external device, a first sub-array that includes a plurality of memory cells connected to a plurality of word lines, a first sub-word line driver that provides a selection voltage or a non-selection voltage to odd-numbered word lines of the plurality of word lines, based on odd-numbered word line control signals corresponding to the odd-numbered word lines, and a second sub-word line driver that provides the selection voltage or the non-selection voltage to even-numbered word lines of the plurality of word lines, based on even-numbered word line control signals corresponding to the even-numbered word lines. The first sub-word line driver is configured to apply the non-selection voltage to non-selection word lines of the even-numbered word lines, in response to the even-numbered word line control signals, and the second sub-word line driver is configured to apply the non-selection voltage to non-selection word lines of the odd-numbered word lines, in response to the odd-numbered word line control signals.

According to an embodiment, a memory device includes a row decoder that generates a first word line selection signal, a first word line non-selection signal, a second word line selection signal, and a second word line non-selection signal, based on a row address received from an external device, a first sub-array that includes a plurality of first memory cells connected to a first word line and a plurality of second memory cells connected to a second word line, a first sub-word line driver that is connected to the first word line, is configured to apply a selection voltage to the first word line in response to the first word line selection signal, and apply a non-selection voltage to the first word line in response to the first word line non-selection signal, and a second sub-word line driver that is connected to the second word line, is configured to apply the selection voltage to the second word line in response to the second word line selection signal, and apply the non-selection voltage to the second word line in response to the second word line non-selection signal. The first sub-word line driver is connected to the second word line and is configured to apply the non-selection voltage to the second word line in response to the second word line non-selection signal, and the second sub-word line driver is connected to the first word line and is configured to apply the non-selection voltage to the first word line in response to the first word line non-selection signal.

According to an embodiment, a memory device includes a first memory cell that includes a storage capacitor, and a selection transistor connected between the storage capacitor and a first word line, a first sub-word line driver that is connected to a first end of the first word line and is configured to apply one of a selection voltage and a non-selection voltage to the first word line in response to a first word line control signal, and a second sub-word line driver that is connected to a second end of the first word line. In response to the first word line control signal, the second sub-word line driver is configured to float the first word line or to apply the non-selection voltage to the first word line.

BRIEF DESCRIPTION OF THE DRAWINGS

The above and other objects and features of the present disclosure will become apparent by describing in detail embodiments thereof with reference to the accompanying drawings.

FIGS. 2A and 2B are diagrams illustrating a memory cell array of a memory device.

DETAILED DESCRIPTION

Below, embodiments of the present disclosure may be described in detail and clearly to such an extent that an ordinary one in the art can implement the invention.

Figure 1:
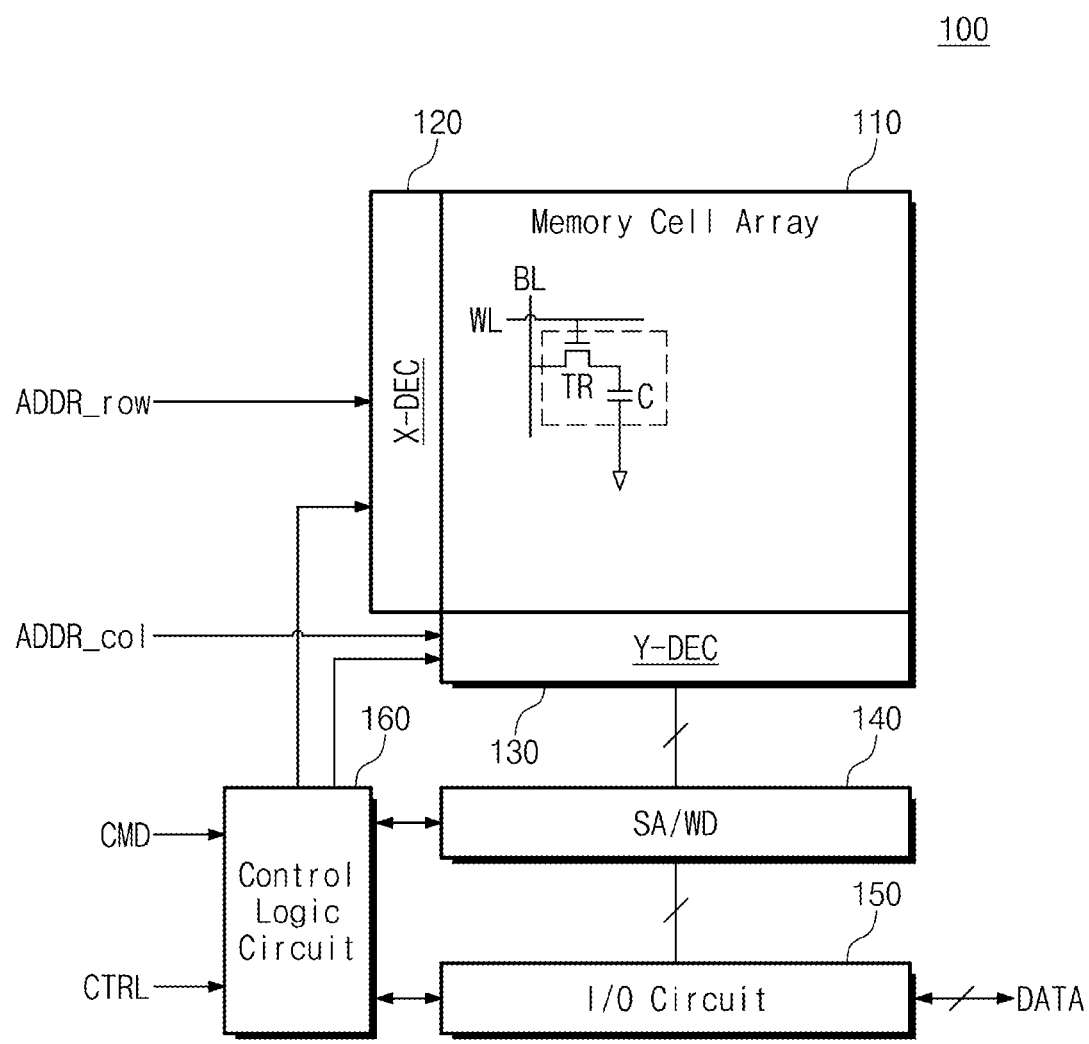
FIG. 1 is a block diagram illustrating a memory device according to an embodiment of the present disclosure.

FIG. 1 is a block diagram illustrating a memory device according to an embodiment of the present disclosure. Referring to FIG. 1, a memory device 100 may include a memory cell array 110, a row decoder ("X-decoder") 120, a column decoder ("Y-decoder") 130, a sense amplifier and write driver 140, an input/output circuit 150, and a control logic circuit 160. In an embodiment, the memory device 100 may be a dynamic random access memory (DRAM) device. However, the present disclosure is not limited thereto. For example, the memory device 100 may be one of various memory devices such as an SRAM, an SDRAM, an MRAM, an FRAM, a ReRAM, a PRAM, and a flash memory.

The memory cell array 110 may include memory cells connected with a plurality of word lines WL and a plurality of bit lines BL. Each of the memory cells may include a selection transistor TR and a storage capacitor C. The selection transistor TR may be connected between the storage capacitor C and the bit line BL and may operate in response to a voltage of the word line WL. The storage capacitor C may be connected between the selection transistor TR and a first node and may store data depending on an operation of the selection transistor TR and a level of the bit line BL.

The X-decoder 120 may be connected with the memory cell array 110 through the plurality of word lines WL. The X-decoder 120 may decode a row address ADDR_row provided from an external device (e.g., a memory controller) and may control voltages of the plurality of word lines WL based on a decoding result.

The Y-decoder 130 may be connected with the memory cell array 110 through the plurality of bit lines BL. The Y-decoder 130 may decode a column address ADDR_col provided from the external device (e.g., a memory controller) and may control the plurality of bit lines BL based on a decoding result.

The sense amplifier and write driver 140 may be configured to read data stored in the memory cell array 110 through the plurality of bit lines BL or to store data in the memory cell array 110 through the plurality of bit lines BL.

The input/output circuit 150 may exchange data DATA with the external device (e.g., a memory controller). The input/output circuit 150 may provide the data DATA received from the external device to the sense amplifier and write driver 140 or may provide the data DATA received from the sense amplifier and write driver 140 to the external device.

The control logic circuit 160 may be configured to control various components of the memory device 100 in response to a command CMD or a control signal CTRL received from the external device.

In an embodiment, in a read operation or a write operation of the memory device 100, a selection voltage, a word line enable voltage, or a high voltage (e.g., a voltage for turning on the selection transistor TR of the memory cell MC) may be applied to a word line selected from the plurality of word lines WL. In this case, the selection voltage, the word line enable voltage, or the high voltage applied to the selection word line may cause word line coupling between the selection word line and adjacent non-selection word lines, and noise may be introduced into non-selection word lines due to the word line coupling. This noise may reduce the reliability of the memory device 100. The memory device 100 according to an embodiment of the present disclosure may inhibit/prevent the above-described noise occurrence through a sub-word line driver configured to control non-selection word lines. A configuration and an operation of the memory device 100 according to an embodiment of the present disclosure will be described in more detail with reference to accompanying drawings.

Figure 2A:
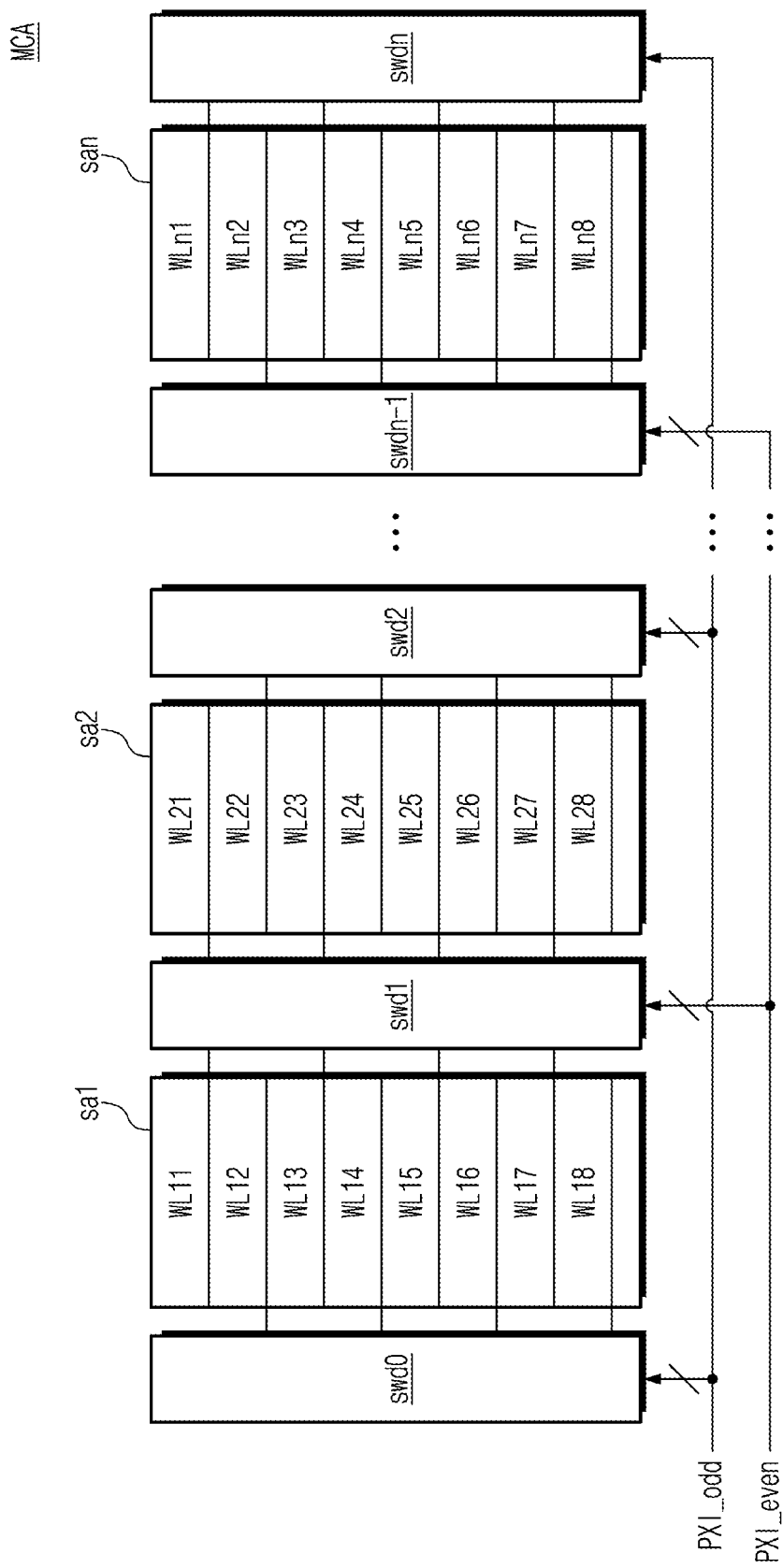

FIGS. 2A and 2B are diagrams illustrating a memory cell array of a memory device. To describe the technical idea of the invention more clearly, a structure and an operation of a memory cell array of a conventional memory device will be described. Below, for brevity of drawing and for convenience of description, components (e.g., bit lines and memory cells) that are unnecessary to describe an embodiment of the present disclosure are omitted in drawings. However, the present disclosure is not limited thereto. Also, an example where each sub-array includes 8 word lines is illustrated in the following drawings, but the number of word lines included in each sub-array may increase/decrease.

Below, the terms "word line control signal", "odd-numbered word line control signal", "even-numbered word line control signal", etc. are used. A word line control signal PXI may refer to a signal for selecting and controlling at least one of a plurality of word lines included in a memory cell array. The word line control signal PXI may be generated by the X-decoder 120, or may be generated through a separate signal generator configured to generate a word line control signal based on a decoding result of the X-decoder 120. An odd-numbered word line control signal may refer to a signal for controlling one or more odd-numbered word lines of the plurality of word lines. An even-numbered word line control signal may refer to a signal for controlling one or more even-numbered word lines of the plurality of word lines. The terms "even-numbered" and "odd-numbered" are used to describe alternate word lines in a sequence (e.g., a column direction) of word lines, and it may be understood that the scope of the invention is not limited to any particular number (whether even or odd) of word lines.

Referring to FIGS. 2A and 2B, a memory cell array MCA may include a plurality of sub-arrays sa1 to san and a plurality of sub-word line drivers swd0 to swdn.

The plurality of sub-arrays sa1 to san may include a plurality of word lines WL11 to WLn8. For example, the first sub-array sa1 may include the word lines WL11 to WL18, the second sub-array sa2 may include the word lines WL21 to WL28, and the n-th sub-array san may include the word lines WLn1 to WLn8. In an embodiment, reference sign WLxy may refer to a word line of a y-th row included in an x-th sub-array. That is, the word lines WL11, WL21, and WLn1 may be word lines that are included in different sub-arrays but are located at the same row, that is, the first row. In an embodiment, word lines located at the same row may be enabled or driven at the same timing. That is, it may be understood that the word lines WL11, WL21, and WLn1 are called a first word line WLx1 corresponding to a first row or share the first word line WLx1 corresponding to the first row.

The plurality of sub-arrays sa1 to san and the plurality of sub-word line drivers swd0 to swdn may be alternately arranged. For example, the first sub-array sa1 may be interposed between the 0-th and first sub word line drivers swd0 and swd1, and the second sub-array sa2 may be interposed between the first and second sub word line drivers swd1 and swd2, and the n-th sub-array san may be interposed between the (n−1)-th and n-th sub word line drivers swdn−1 and swdn.

The 0-th sub-word line driver swd0 may be connected with even-numbered word lines WL12, WL14, WL16, and WL18 of the word lines WL11 to WL18 of the first sub-array sa1, and may be configured to control the word lines WL12, WL14, WL16, and WL18. The first sub-word line driver swd1 may be connected with odd-numbered word lines WL11, WL13, WL15, WL17, WL21, WL23, WL25, and WL27 of the word lines WL11 to WL18 and WL21 to WL28 of the first and second sub-arrays sa1 and sa2, and may be configured to control the word lines WL11, WL13, WL15, WL17, WL21, WL23, WL25, and WL27 in response to odd-numbered word line control signals PXI_odd. The (n−1)-th sub-word line driver swdn−1 may be connected with even-numbered word lines WLn2, WLn4, WLn6, and WLn8 of the word lines WLn1 to WLn8 of the n-th sub-array san, and may be configured to control the word lines WLn2, WLn4, WLn6, and WLn8 in response to even-numbered word line control signals PXI_even. The n-th sub-word line driver swdn may be connected with odd-numbered word lines WLn1, WLn3, WLn5, and WLn7 of the word lines WLn1 to WLn8 of the n-th sub-array san, and may be configured to control the word lines WLn1, WLn3, WLn5, and WLn7 in response to odd-numbered word line control signals PXI_odd.

In an embodiment, the first and n-th sub-word line drivers swd1 and swdn configured to control the odd-numbered word lines WL11, WL13, WL15, WL17, WL21, WL23, WL25, WL27, WLn1, WLn3, WLn5, and WLn7 may operate in response to the odd-numbered word line control signals PXI_odd. The 0-th, second, and (n−1)-th sub-word line drivers swd0, swd2, and swdn−1 configured to control the even-numbered word lines WL12, WL14, WL16, WL18, WL22, WL24, WL26, WL28, WLn2, WLn4, WLn6, and WLn8 may operate in response to the even-numbered word line control signals PXI_even.

For example, as illustrated in FIG. 2B, the first sub-word line driver swd1 may include word line driving circuits wdc1_1 and wdc1_3. The word line driving circuit wdc1_1 may control the first word line WL21 of the sub-array sa2 in response to the first word line control signal PXI1. The word line driving circuit wdc1_3 may control the third word line WL23 of the sub-array sa2 in response to the third word line control signal PXI3.

The second sub-word line driver swd2 may include word line driving circuits wdc2_2 and wdc2_4. The word line driving circuit wdc2_2 may control the second word line WL22 of the sub-array sa2 in response to the second word line control signal PXI2. The word line driving circuit wdc2_4 may control the fourth word line WL24 of the sub-array sa2 in response to the fourth word line control signal PXI4.

In an embodiment, it is assumed that the third word line WL23 is a selected word line. In this case, the word line driving circuit wdc1_3 of the first sub-word line driver swd1 may provide a high voltage HIGH to the third word line WL23 in response to the third word line control signal PXI3. The first sub-word line driver wdc1_1 may provide a low voltage LOW to the first word line WL21 in response to the first word line control signal PXI1. The word line driving circuits wdc2_2 and wdc2_4 of the second sub-word line driver swd2 may provide the low voltage LOW to the second and fourth word lines WL22 and WL24 in response to the second and fourth word line control signals PXI2 and PXI4. As illustrated in FIG. 2B, the second and fourth word lines WL22 and WL24 are in a floating state in a region adjacent to the first sub-word line driver swd1. In this case, in the region adjacent to the first sub-word line driver swd1, coupling (i.e., the WL-to-WL coupling) may occur between the second and fourth word lines WL22 and WL24, and thus, noise may be introduced into the second and fourth word lines WL22 and WL24 being non-selection word lines. This noise may cause the reduction of reliability of the memory device.

In an embodiment, the high voltage HIGH may indicate a selection voltage to be provided to a selection word line, and the low voltage LOW may be a non-selection voltage to be provided to non-selection word lines. Selection transistors of memory cells may be turned on by the selection voltage and may be turned off by the non-selection voltage.

Figure 3:
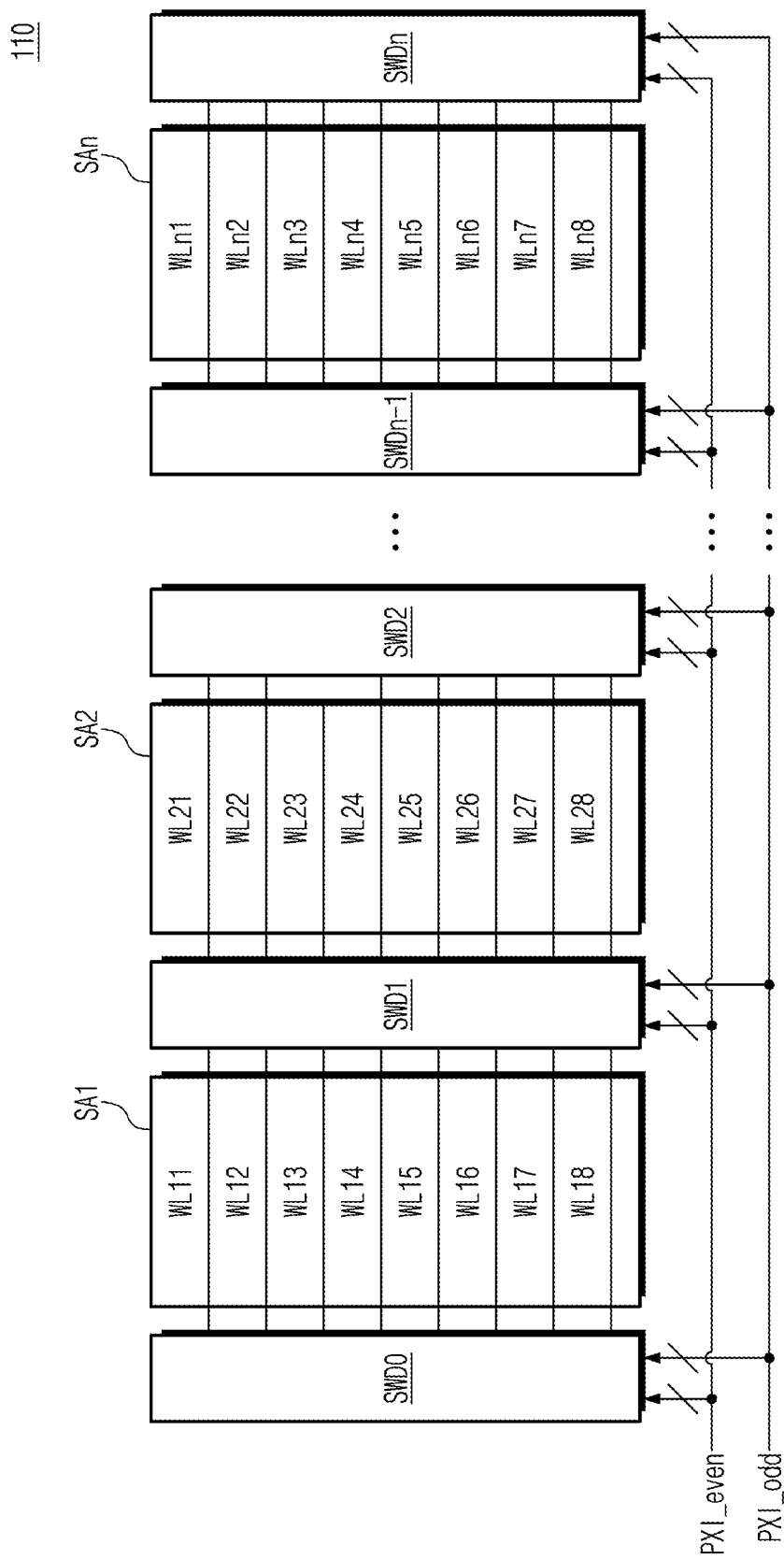
FIG. 3 is a diagram illustrating a memory cell array of FIG. 1.
Figure 4:
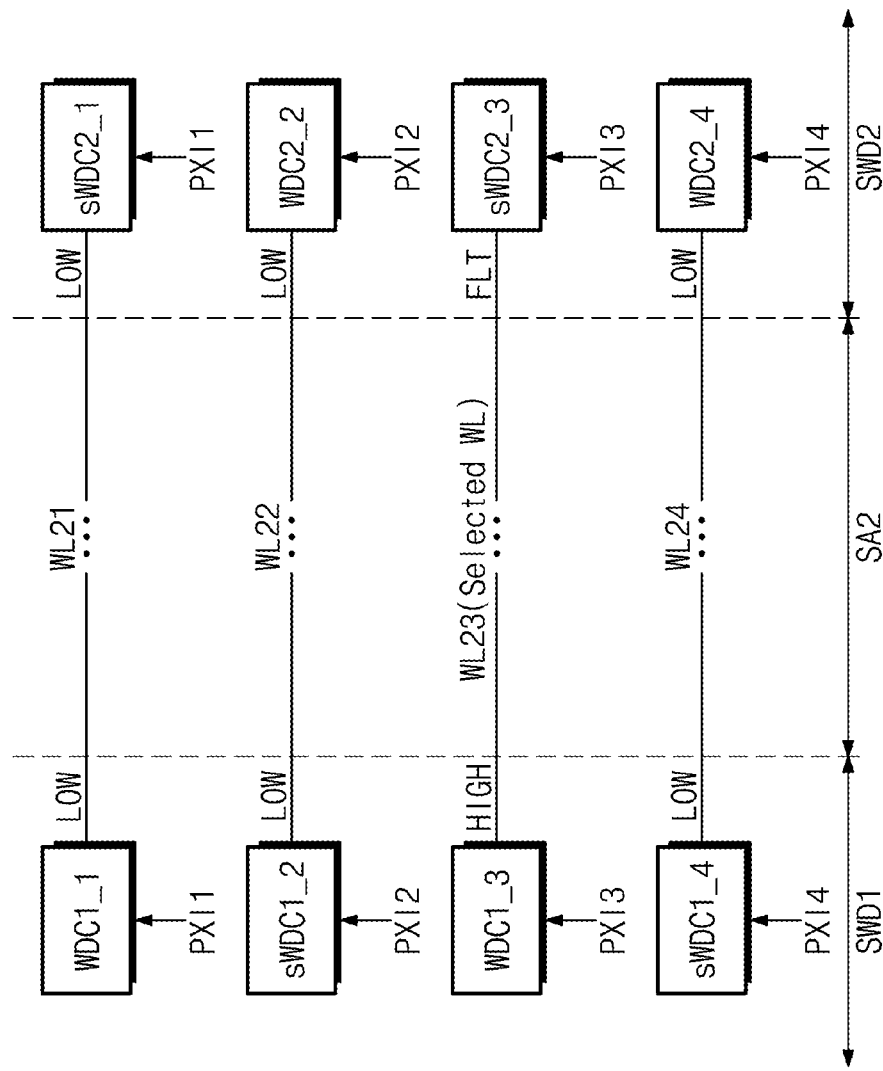
FIG. 4 is a diagram illustrating a structure of first and second sub-word line drivers of FIG. 3.

FIG. 3 is a diagram illustrating a memory cell array of FIG. 1. FIG. 4 is a diagram illustrating a structure of first and second sub-word line drivers of FIG. 3. For convenience of description, additional description associated with components similar to the above-described components may be omitted to avoid redundancy. Referring to FIGS. 1, 3, and 4, the memory cell array 110 according to an embodiment of the present disclosure may include a plurality of sub-arrays SA1 to SAn and a plurality of sub-word line drivers SWD0 to SWDn. The placement of the plurality of sub-arrays SA1 to SAn and the plurality of sub-word line drivers SWD0 to SWDn is similar to that described with reference to FIG. 2A, and thus, additional description may be omitted to avoid redundancy.

As illustrated in FIG. 3, the 0-th sub-word line driver SWD0 may be connected with the plurality of word lines WL11 to WL18 of the first sub-array SA1. The first sub-word line driver SWD1 may be connected with the plurality of word lines WL11 to WL18 to WL21 to WL28 of the first and second sub-arrays SA1 and SA2. The second sub-word line driver SWD2 may be connected with the plurality of word lines WL21 to WL28 of the second sub-array SA2. The (n−1)-th sub-word line driver SWDn−1 may be connected with the plurality of word lines WLn1 to WLn8 of the n-th sub-array SAn. The n-th sub-word line driver SWDn may be connected with the plurality of word lines WLn1 to WLn8 of the n-th sub-array SAn. That is, unlike the memory cell array MCA of FIG. 2A, the sub-word line drivers SWD0 to SWDn of the memory cell array 110 according to an embodiment of the present disclosure may be connected with all word lines of an adjacent sub-array.

The 0-th sub-word line driver SWD0 may control the plurality of word lines WL11 to WL18 of the first sub-array SA1 in response to an odd-numbered word line control signal PXI_odd and an even-numbered word line control signal PXI_even. The first sub-word line driver SWD1 may control the plurality of word lines WL11 to WL18 and WL21 to WL28 of the first and second sub-arrays SA1 and SA2 in response to the odd-numbered word line control signal PXI_odd and the even-numbered word line control signal PXI_even. Likewise, each of the remaining sub-word line drivers SWD2 to SWDn may control a plurality of word lines of an adjacent sub-array in response to the odd-numbered word line control signal PXI_odd and the even-numbered word line control signal PXI_even.

In an embodiment, in response to the even-numbered word line control signal PXI_even, the 0-th sub-word line driver SWD0 may enable one (i.e., a selected word line) of the even-numbered word lines WL12, WL14, WL16, and WL18 of the first sub-array SA1 or may apply a high voltage thereto. In response to the odd-numbered word line control signal PXI_odd and the even-numbered word line control signal PXI_even, the 0-th sub-word line driver SWD0 may apply a low voltage to unselected word lines of the plurality of word lines WL11 to WL18 of the first sub-array SA1. In response to the odd-numbered word line control signal PXI_odd, the first sub-word line driver SWD1 may enable a pair of word lines (i.e., a pair of selected word lines) of the odd-numbered word lines WL11/WL21, WL13/WL23, WL15/WL25, and WL17/WL27 of the first and second sub-arrays SA1 and SA2 or may apply a high voltage thereto. In response to the odd-numbered word line control signal PXI_odd and the even-numbered word line control signal PXI_even, the first sub-word line driver SWD1 may apply the low voltage to unselected word lines of the plurality of word lines WL11 to WL18 and WL21 to WL28 of the first and second sub-arrays SA1 and SA2.

In more detail, as illustrated in FIG. 4, the first sub-word line driver SWD1 may include main word line driving circuits WDC1_1 and WDC1_3 (for convenience of description, hereinafter referred to as "main driving circuits"). The main driving circuit WDC1_1 may be connected with the first word line WL21 of the second sub-array SA2 and may operate in response to the first word line control signal PXI1. The main driving circuit WDC1_3 may be connected with the third word line WL23 of the second sub-array SA2 and may operate in response to the third word line control signal PXI3. The second sub-word line driver SWD2 may include main driving circuits WDC2_2 and WDC2_4. The main driving circuit WDC2_2 may be connected with the second word line WL22 of the second sub-array SA2 and may operate in response to the second word line control signal PXI2. The main driving circuit WDC2_4 may be connected with the fourth word line WL24 of the second sub-array SA2 and may operate in response to the fourth word line control signal PXI4. That is, when an odd-numbered word line (i.e., one of WL21 and WL23) is a selected word line, the high voltage may be applied to the selected word line by the second sub-word line driver SWD2; when an even-numbered word line (i.e., one of WL22 and WL24) is a selected word line, the high voltage may be applied to the selected word line by the first sub-word line driver SWD1.

When an odd-numbered word line is a selected word line, the low voltage may be applied to the remaining odd-numbered word lines (i.e., unselected odd-numbered word lines) by the second sub-word line driver SWD2; when an even-numbered word line is a selected word line, the low voltage may be applied to the remaining even-numbered word lines (i.e., unselected even-numbered word lines) by the first sub-word line driver SWD1.

In an embodiment, sub-word line drivers according to an embodiment of the present disclosure may further include a supplementary word line driving circuit (for convenience of description, hereinafter referred to as a "supplementary driving circuit") configured to control non-selection word lines.

For example, the first sub-word line driver SWD1 may include supplementary driving circuits sWDC1_2 and sWDC1_4. The supplementary driving circuit sWDC1_2 may be connected with the second word line WL22, and the supplementary driving circuit sWDC1_4 may be connected with the fourth word line WL24. The supplementary driving circuit sWDC1_2 may operate in response to the second word line control signal PXI2, and the supplementary driving circuit sWDC1_4 may operate in response to the fourth word line control signal PXI4. For example, when the second word line WL22 is a non-selection word line, the supplementary driving circuit sWDC1_2 may apply the low voltage to the second word line WL22 in response to the second word line control signal PXI2. When the fourth word line WL24 is a non-selection word line, the supplementary driving circuit sWDC1_4 may apply the low voltage to the fourth word line WL24 in response to the fourth word line control signal PXI4.

The second sub-word line driver SWD2 may include supplementary driving circuits sWDC2_1 and sWDC2_3. The supplementary driving circuit sWDC2_1 may be connected with the first word line WL21, and the supplementary driving circuit sWDC2_3 may be connected with the third word line WL23. The supplementary driving circuit sWDC2_1 may operate in response to the first word line control signal PXI1, and the supplementary driving circuit sWDC2_3 may operate in response to the third word line control signal PXI3. For example, when the first word line WL21 is a non-selection word line, the supplementary driving circuit sWDC2_1 may apply the low voltage to the first word line WL21 in response to the first word line control signal PXI1. When the third word line WL23 is a non-selection word line, the supplementary driving circuit sWDC2_3 may apply the low voltage to the third word line WL23 in response to the third word line control signal PXI3.

As described above, when a specific word line is a non-selection word line, a low voltage may be applied to the specific word line from sub-word line drivers adjacent to the specific word line. In this case, because one end of a non-selection word line is not floated, the noise introduction due to the coupling between a selection word line and an adjacent non-selection word line may be reduced.

For example, as illustrated in FIG. 4, it is assumed that the third word line WL23 is a selection word line. In this case, in response to a first word line control signal PXI1, the main driving circuit WDC1_1 of the first sub-word line driver SWD1 and the supplementary driving circuit sWDC2_1 of the second sub-word line driver SWD2 may apply the low voltage LOW to the first word line WL21. In response to a second word line control signal PXI2, the supplementary driving circuit sWDC1_2 of the first sub-word line driver SWD1 and the main driving circuit WDC2_2 of the second sub-word line driver SWD2 may apply the low voltage LOW to the second word line WL22. In response to a third word line control signal PXI3, the main driving circuit WDC1_3 of the first sub-word line driver SWD1 may apply the high voltage HIGH to the third word line WL23, and the supplementary driving circuit sWDC2_3 of the second sub-word line driver SWD2 may float FLT the third word line WL23. In response to a fourth word line control signal PXI4, the main driving circuit WDC2_4 of the second sub-word line driver SWD2 and the supplementary driving circuit sWDC1_4 of the first sub-word line driver SWD1 may apply the low voltage LOW to the fourth word line WL24.

As described above, a main driving circuit of a sub-word line driver may apply the high voltage HIGH or the low voltage LOW to the corresponding word line in response to the corresponding word line control signal, and a supplementary driving circuit may apply the low voltage LOW to the corresponding word line or may float FLT the corresponding word line. In this case, because the low voltage LOW is applied to opposite ends of a non-selection word line adjacent to a selection word line, the noise introduction due to the coupling may be reduced/prevented.

Figure 5A:
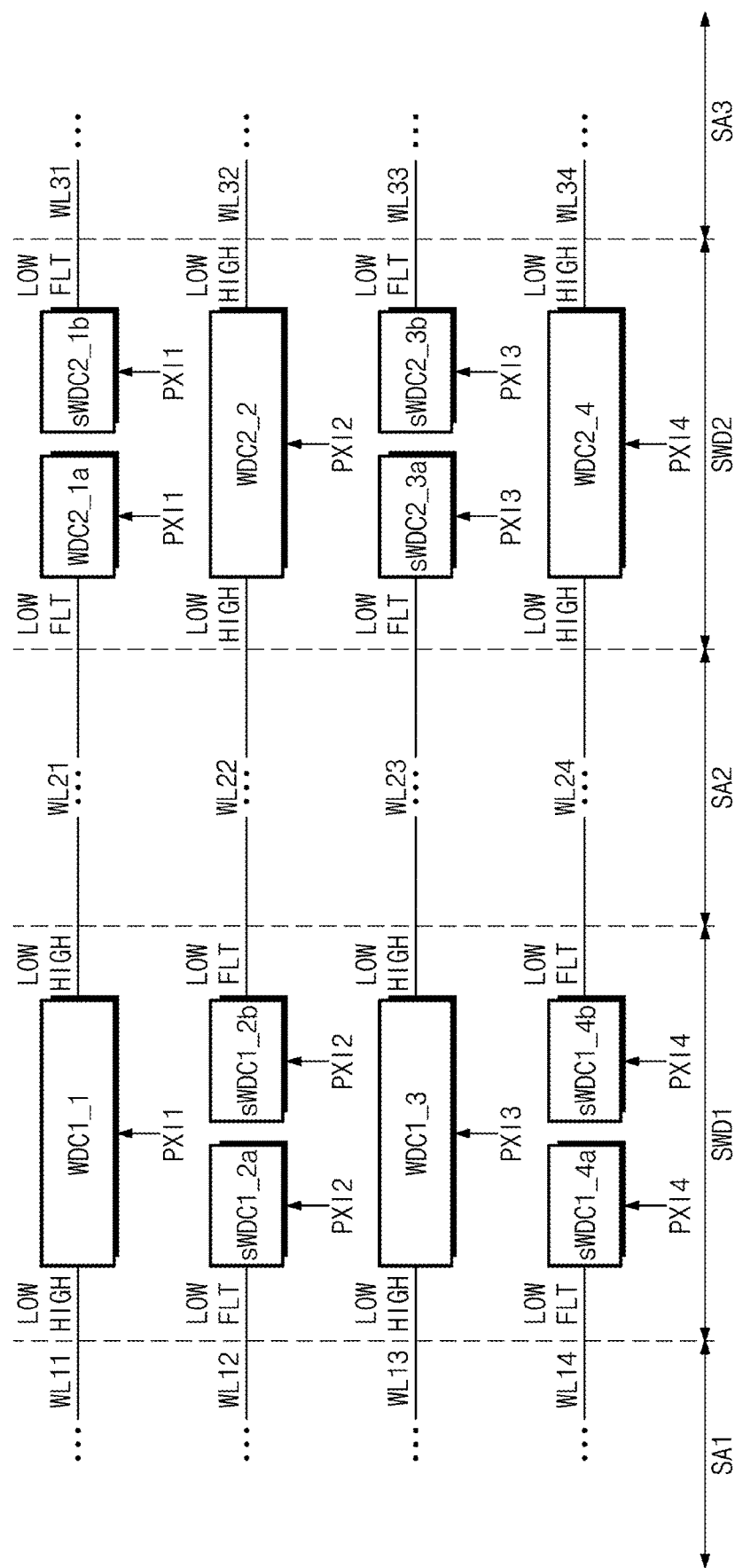
FIGS. 5A and 5B are diagrams illustrating sub-word line drivers of FIG. 3 in more detail.
Figure 5B:
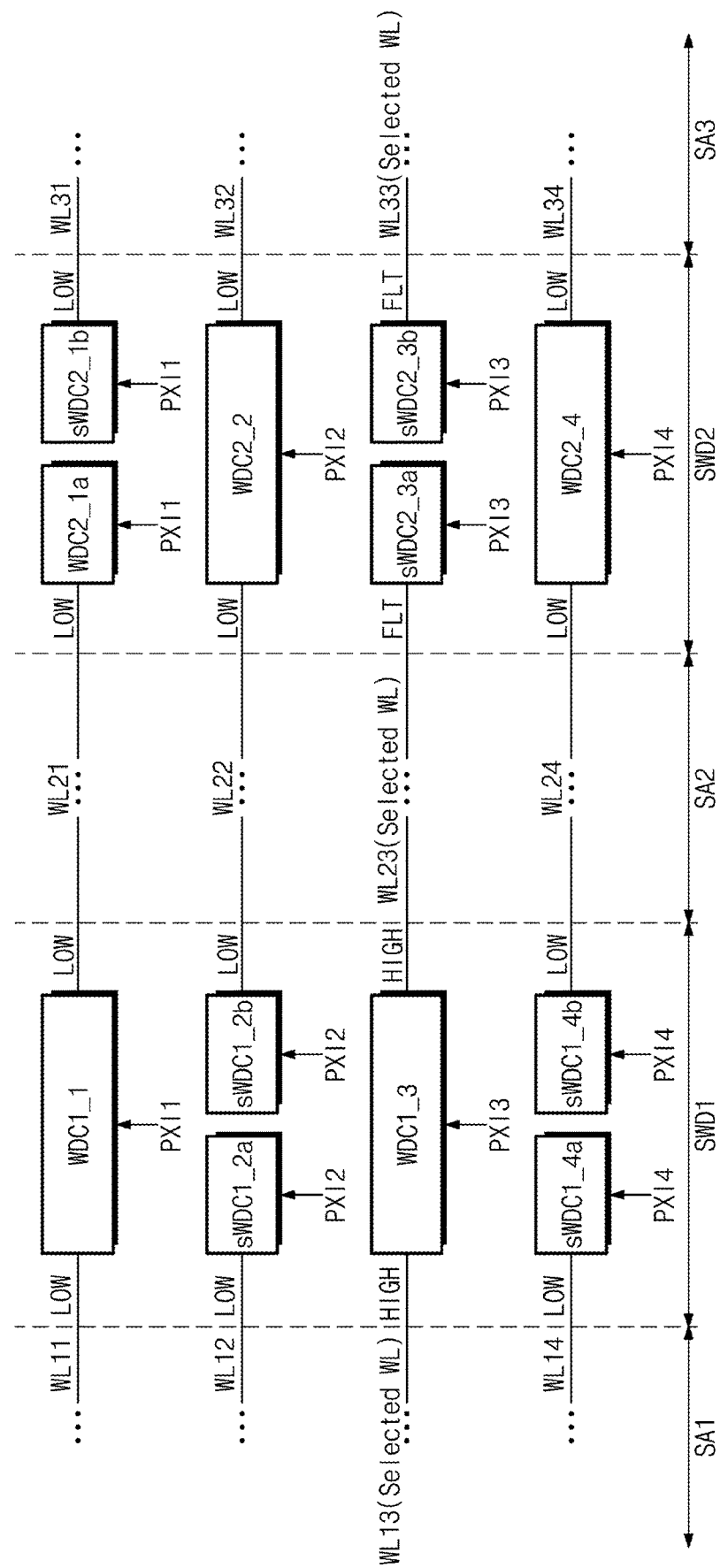

FIGS. 5A and 5B are diagrams illustrating sub-word line drivers of FIG. 3 in more detail. For convenience of description, additional description associated with the components described above may be omitted to avoid redundancy. For convenience of description, a partial configuration of the memory cell array 110 is illustrated in FIG. 5, but the present disclosure is not limited thereto.

Referring to FIGS. 3, 5A, and 5B, the first sub-word line driver SWD1 may include the main driving circuits WDC1_1 and WDC1_3 and supplementary driving circuits sWDC1_2a, sWDC1_2b, sWDC1_4a, and sWDC1_4b. The main driving circuit WDC1_1 may apply the low voltage LOW or the high voltage HIGH to the first word lines WL11 and WL21 of the first and second sub-arrays SA1 and SA2 in response to the first word line control signal PXI1. The main driving circuit WDC1_3 may apply the low voltage LOW or the high voltage HIGH to the third word lines WL13 and WL23 of the first and second sub-arrays SA1 and SA2 in response to the third word line control signal PXI3.

In response to the second word line control signal PXI2, the supplementary driving circuit sWDC1_2a may apply the low voltage LOW to the second word line WL12 of the first sub-array SA1 or may float FLT the second word line WL12. In response to the second word line control signal PXI2, the supplementary driving circuit sWDC1_2b may apply the low voltage LOW to the second word line WL22 of the second sub-array SA2 or may float FLT the second word line WL22. In response to the fourth word line control signal PXI4, the supplementary driving circuit sWDC1_4a may apply the low voltage LOW to the fourth word line WL14 of the first sub-array SA1 or may float FLT the fourth word line WL14. In response to the fourth word line control signal PXI4, the supplementary driving circuit sWDC1_4b may apply the low voltage LOW to the fourth word line WL24 of the second sub-array SA2 or may float FLT the fourth word line WL24.

The second sub-word line driver SWD2 may include the main driving circuits WDC2_2 and WDC2_4 and supplementary driving circuits sWDC2_1a, sWDC2_1b, sWDC2_3a, and sWDC2_3b.

The main driving circuit WDC2_2 may apply the low voltage LOW or the high voltage HIGH to the second word lines WL22 and WL32 of the second and third sub-arrays SA2 and SA3 in response to the second word line control signal PXI2. The main driving circuit WDC2_4 may apply the low voltage LOW or the high voltage HIGH to the fourth word lines WL24 and WL34 of the second and third sub-arrays SA2 and SA3 in response to the fourth word line control signal PXI4.

In response to the first word line control signal PXI1, the supplementary driving circuit sWDC2_1a may apply the low voltage LOW to the first word line WL21 of the second sub-array SA2 or may float FLT the second word line WL21. In response to the first word line control signal PXI1, the supplementary driving circuit sWDC2_1b may apply the low voltage LOW to the first word line WL31 of the third sub-array SA3 or may float FLT the first word line WL31. In response to the third word line control signal PXI3, the supplementary driving circuit sWDC2_3a may apply the low voltage LOW to the third word line WL23 of the second sub-array SA2 or may float FLT the third word line WL23. In response to the third word line control signal PXI3, the supplementary driving circuit sWDC2_3b may apply the low voltage LOW to the third word line WL33 of the third sub-array SA3 or may float FLT the third word line WL33.

In an embodiment, supplementary driving circuits configured to control word lines of the same row may be integrated to one supplementary driving circuit. For example, in the first sub-word line driver SWD1, the supplementary driving circuits sWDC1_2a and sWDC1_2b configured to drive word lines (e.g., WL12 and WL22) of the second row may be implemented with one supplementary driving circuit.

To describe an embodiment of the present disclosure briefly, it is assumed that a third word line (i.e., WL13, WL23, WL33, etc.) is a selected word line. In this case, as illustrated in FIG. 5B, the first sub-word line driver SWD1 may apply the high voltage HIGH to the third word lines WL13 and WL23 (i.e., selection word lines) of the first and second sub-arrays SA1 and SA2, and may apply the low voltage LOW to the first, second, and fourth word lines WL11, WL21, WL12, WL22, WL14, and WL24 (i.e., non-selection word lines) of the first and second sub-arrays SA1 and SA2. The second sub-word line driver SWD2 may apply the low voltage LOW to the first, second, and fourth word lines WL21, WL31, WL22, WL32, WL24, and WL34 (i.e., non-selection word lines) of the second and third sub-arrays SA2 and SA3, and may float FLT the third word lines WL23 and WL33 (i.e., selection word lines) of the second and third sub-arrays SA2 and SA3.

In this case, because the first sub-word line driver SWD1 applying the high voltage HIGH to both third word lines (e.g., WL13 and WL23) applies the low voltage LOW to adjacent non-selection word lines (e.g., WL12, WL14, WL22, and WL24) together, word line coupling at a region adjacent to the first sub-word line driver SWD1 may be reduced/prevented.

Figure 6:
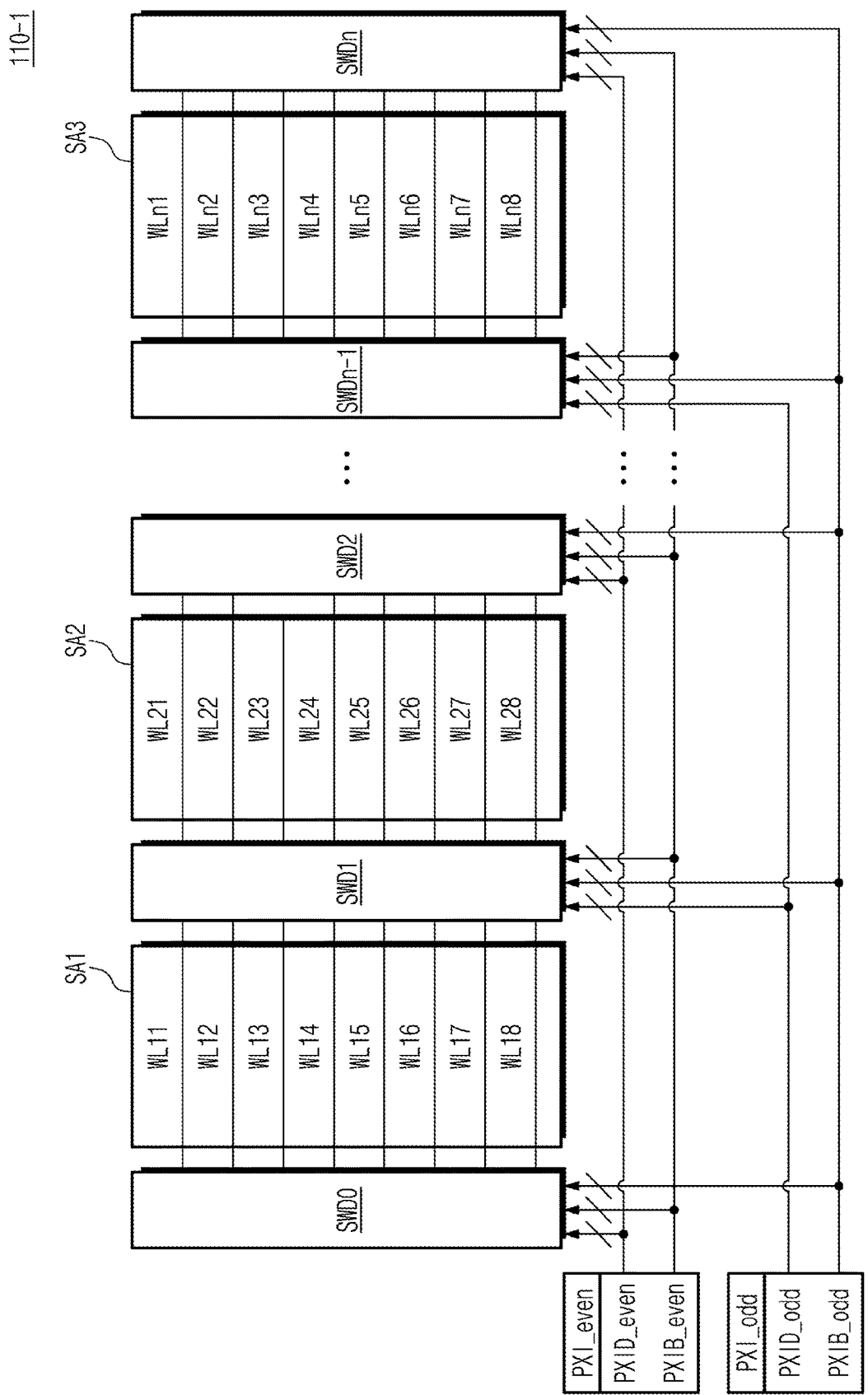
FIG. 6 is a diagram illustrating a memory cell array of FIG. 1.

FIG. 6 is a diagram illustrating a memory cell array of FIG. 1. Referring to FIGS. 1 and 6, a memory cell array 110-1 may include a plurality of sub-word line drivers SWD0 to SWDn and a plurality of sub-arrays SA1 to SA3. The placement of the plurality of sub-word line drivers SWD0 to SWDn and the plurality of sub-arrays SA1 to SA3 is similar to that described with reference to FIG. 3, and thus, additional description may be omitted to avoid redundancy.

In an embodiment, a word line control signal PXI may include a word line selection signal PXID and a word line non-selection signal PXIB. The word line selection signal PXID may be a signal indicating a selection word line, and a word line non-selection signal PXIB may be a signal indicating a non-selection word line.

An odd-numbered word line control signal PXI_odd may include an odd-numbered word0 line selection signal PXID odd and an odd-numbered word line non-selection signal PXIB_odd. An even-numbered word line control signal PXI_even may include an even-numbered word line selection signal PXID even and an even-numbered word line non-selection signal PXIB_even.

In an embodiment, the 0-th, second, and n-th sub-word line drivers SWD0, SWD2, and SWDn may selectively apply the high voltage to even-numbered word lines in response to the even-numbered word line selection signal PXID even, may selectively apply the low voltage to even-numbered word lines in response to the even-numbered word line non-selection signal PXIB_even, and may selectively apply the low voltage to odd-numbered word lines in response to the odd-numbered word line non-selection signal PXIB_odd.

The first, and (n−1)-th sub-word line drivers SWD1, and SWDn−1 may selectively apply the high voltage to odd-numbered word lines in response to the odd-numbered word line selection signal PXID odd, may selectively apply the low voltage to odd-numbered word lines in response to the odd-numbered word line non-selection signal PXIB_odd, and may selectively apply the low voltage to even-numbered word lines in response to the even-numbered word line non-selection signal PXIB_even.

That is, according to an embodiment of the present disclosure, the word line non-selection signals PXIB_odd and PXIB_even may be provided to all the sub-word line drivers SWD0 to SWDn, and the word line selection signals PXID odd and PXID even may be provided to the corresponding sub-word line drivers.

Figure 7:
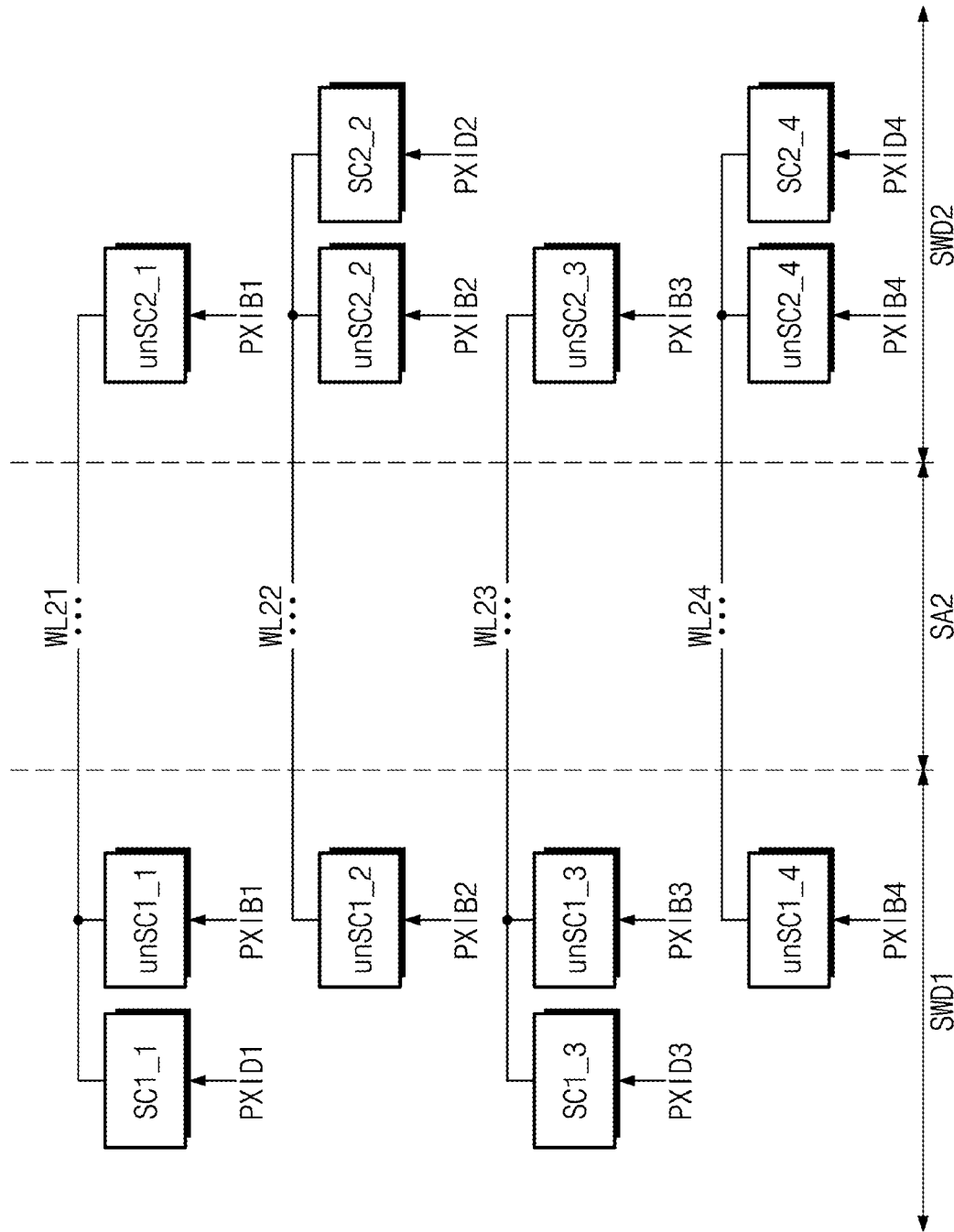
FIG. 7 is a diagram illustrating first and second sub-word line drivers of FIG. 6.

FIG. 7 is a diagram illustrating first and second sub-word line drivers of FIG. 6. Referring to FIGS. 6 and 7, the first sub-word line driver SWD1 may include selection circuits SC1_1 and SC1_3 and non-selection circuits unSC1_1, unSC1_2, unSC1_3, and unSC1_4. The second sub-word line driver SWD2 may include selection circuits SC2_2 and SC2_4 and non-selection circuits unSC2_1, unSC2_2, unSC2_3, and unSC2_4.

The selection circuit SC1_1 of the first sub-word line driver SWD1 may be connected with a first end of the first word line WL21 and may operate in response to a first word line selection signal PXID1. The non-selection circuit unSC1_1 of the first sub-word line driver SWD1 may be connected with the first end of the first word line WL21 and may operate in response to a first word line non-selection signal PXIB1. The non-selection circuit unSC2_1 of the second sub-word line driver SWD2 may be connected with a second end of the first word line WL21 and may operate in response to the first word line non-selection signal PXIB1.

That is, when the first word line WL21 is a selection word line, the selection circuit SC1_1 of the first sub-word line driver SWD1 may apply the high voltage to the first word line WL21 in response to the first word line selection signal PXID1. When the first word line WL21 is a non-selection word line, the non-selection circuit unSC1_1 of the first sub-word line driver SWD1 and the non-selection circuit unSC2_1 of the second sub-word line driver SWD2 may apply the low voltage to the first word line WL21 in response to the first word line non-selection signal PXIB1. In other words, when the first word line WL21 is a non-selection word line, the low voltage may be applied to the opposite ends (i.e., first and second ends) of the first word line WL21 by the first and second sub-word line drivers SWD1 and SWD2.

The non-selection circuit unSC1_2 of the first sub-word line driver SWD1 may be connected with a first end of the second word line WL22 and may operate in response to a second word line non-selection signal PXIB2. The selection circuit SC2_2 of the second sub-word line driver SWD2 may be connected with a second end of the second word line WL22 and may operate in response to a second word line selection signal PXID2. The non-selection circuit unSC2_2 of the second sub-word line driver SWD2 may be connected with a second end of the second word line WL22 and may operate in response to the second word line non-selection signal PXIB2.

The selection circuit SC1_3 of the first sub-word line driver SWD1 may be connected with a first end of the third word line WL23 and may operate in response to a third word line selection signal PXID3. The non-selection circuit unSC1_3 of the first sub-word line driver SWD1 may be connected with the first end of the third word line WL23 and may operate in response to a third word line non-selection signal PXIB3. The non-selection circuit unSC2_3 of the second sub-word line driver SWD2 may be connected with a second end of the third word line WL23 and may operate in response to the third word line non-selection signal PXIB3.

The non-selection circuit unSC1_4 of the first sub-word line driver SWD1 may be connected with a first end of the fourth word line WL24 and may operate in response to a fourth word line non-selection signal PXIB4. The selection circuit SC2_4 of the second sub-word line driver SWD2 may be connected with a second end of the fourth word line WL24 and may operate in response to a fourth word line selection signal PXID4. The non-selection circuit unSC2_4 of the second sub-word line driver SWD2 may be connected with the second end of the fourth word line WL24 and may operate in response to the fourth word line non-selection signal PXIB4.

Operations of the selection circuits SC1_3 and SC2_2 and the non-selection circuits unSC1_2, unSC1_3, unSC1_4, unSC2_2, unSC2_3, and unSC2_4 are similar to the operations of the selection circuit SC1_1 and the non-selection circuits unSC1_1 and unSC2_1 described above, and thus, additional description may be omitted to avoid redundancy.

In an embodiment, a selection circuit and a non-selection circuit (e.g., SC1_1 and unSC1_1) that are connected with one word line and are included in one sub-word line driver may correspond to a main word line driver (e.g., WDC1_1) described with reference to FIGS. 4, 5A, and 5B. A non-selection circuit (e.g., unSC1_2) that is connected with one word line and is included in one sub-word line driver may correspond to a supplementary word line driver (e.g., sWDC1_2) described with reference to FIGS. 4, 5A, and 5B.

Figure 8:
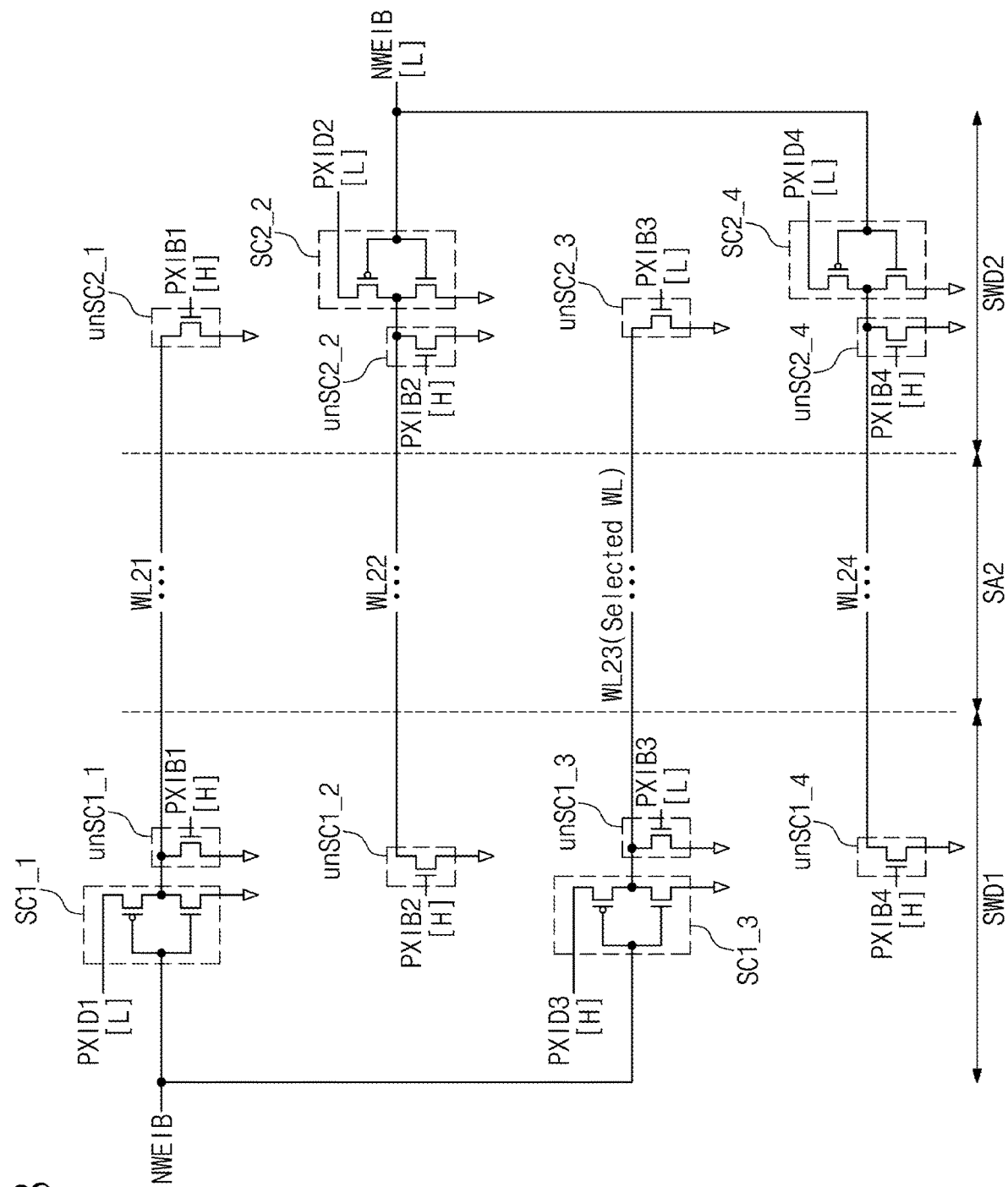
FIG. 8 is a circuit diagram illustrating first and second sub-word line drivers of FIG. 7.

FIG. 8 is a circuit diagram illustrating first and second sub-word line drivers of FIG. 7. For convenience of description, additional description associated with the components described above may be omitted to avoid redundancy. Referring to FIGS. 1, 7, and 8, the selection circuit SC1_1 of the first sub-word line driver SWD1 may provide the first word line selection signal PXID1 to the first word line WL21 in response to a sub-word line driver enable signal NWEIB. For example, the selection circuit SC1_1 of the first sub-word line driver SWD1 may include a PMOS transistor connected between the first word line selection signal PXID1 and the first word line WL21 and an NMOS transistor connected between the first word line WL21 and a low voltage terminal. The PMOS transistor and the NMOS transistor may operate in response to the sub-word line driver enable signal NWEIB. That is, when the sub-word line driver enable signal NWEIB is at a low level L, the first selection circuit SC1_1 may provide the first word line selection signal PXID1 to the first word line WL21. In an embodiment, the first word line selection signal PXID1 may be of the high voltage HIGH.

The non-selection circuit unSC1_1 of the first sub-word line driver SWD1 may include an NMOS transistor that is connected between the first word line WL21 and the low voltage terminal and operates in response to the first word line non-selection signal PXIB1. That is, when the first word line non-selection signal PXIB1 is at a high level H, the NMOS transistor may provide the low voltage to the first word line WL21.

Operations and structures of the remaining selection circuits SC1_3, SC2_2, and SC2_4 and the remaining non-selection circuits unSC1_2, unSC1_3, unSC1_4, unSC2_1, unSC2_2, unSC2_3, and unSC2_4 are similar to the operations and structures of the selection circuit SC1_1 and the non-selection circuit unSC1_1 except that signals input thereto are different, and thus, additional description may be omitted to avoid redundancy.

To describe the first and second sub-word line drivers SWD1 and SWD2 easily, it is assumed that the third word line WL23 is a selection word line. In this case, as illustrated in FIG. 8, the third word line selection signal PXID3 and the first, second, and fourth word line non-selection signals PXIB1, PXIB2, and PXIB4 may be of the high level H or the high voltage HIGH, and the first, second, and fourth word line selection signals PXID1, PXID2, and PXID4 and the third word line non-selection signal PXIB3 may be of the low level L or the low voltage LOW. That is, a word line selection signal and a corresponding word line non-selection signal may be complementary.

The selection circuits SC1_1, SC1_3, SC2_2, and SC2_4 may operate in response to the sub-word line driver enable signal NWEIB of the low level L. Because the sub-word line driver enable signal NWEIB is at the low level L and the third word line selection signal PXID3 is at the high level H, the PMOS transistor of the selection circuit SC1_3 corresponding to the third word line WL23 may be turned on, and thus, the third word line selection signal PXID3 may be provided to the third word line WL23. The non-selection circuits unSC1_3 and unSC2_3 corresponding to the third word line WL23 may be turned off in response to the third word line non-selection signal PXIB3 of the low level L.

Because the sub-word line driver enable signal NWEIB and the first, second, and fourth word line selection signals PXID1, PXID2, and PXID4 are at the low level L, the PMOS transistors of the selection circuits SC1_1, SC2_2, and SC2_4 may not be turned on. The non-selection circuits unSC1_1 and unSC2_1 corresponding to the first word line WL21 may be turned on in response to the first word line non-selection signal PXIB1 of the high level H, and thus, the low voltage LOW may be provided to the first word line WL21. Likewise, the non-selection circuits unSC1_2, unSC2_2, unSC1_4, and unSC2_4 corresponding to the second and fourth word lines WL22 and WL24 may be turned on in response to the second and fourth word line non-selection signals PXIB2 and PXIB4 of the high level H, and thus, the low voltage LOW may be provided to the second and fourth word lines WL22 and WL24.

According to the example of FIG. 8, when the third word line WL23 is a selection word line, the high voltage HIGH may be applied to the third word line WL23 by the first sub-word line driver SWD1. In this case, the low voltage LOW may be applied to the second and fourth word lines WL22 and WL24 being non-selection word lines adjacent to the selection word line, by the first and second sub-word line drivers SWD1 and SWD2. (For example, the second and fourth word lines WL22 and WL24 may be the closest word lines of the second sub-array SA2 to the third word line WL23, as no other word line of the second sub-array SA2 may be between the second and third word lines WL2 and WL3 or between the third and fourth word lines WL3 and WL4.) Accordingly, noise due to the word line coupling may be inhibited/prevented from being introduced into the non-selection word lines adjacent to the selection word line.

Figure 9:
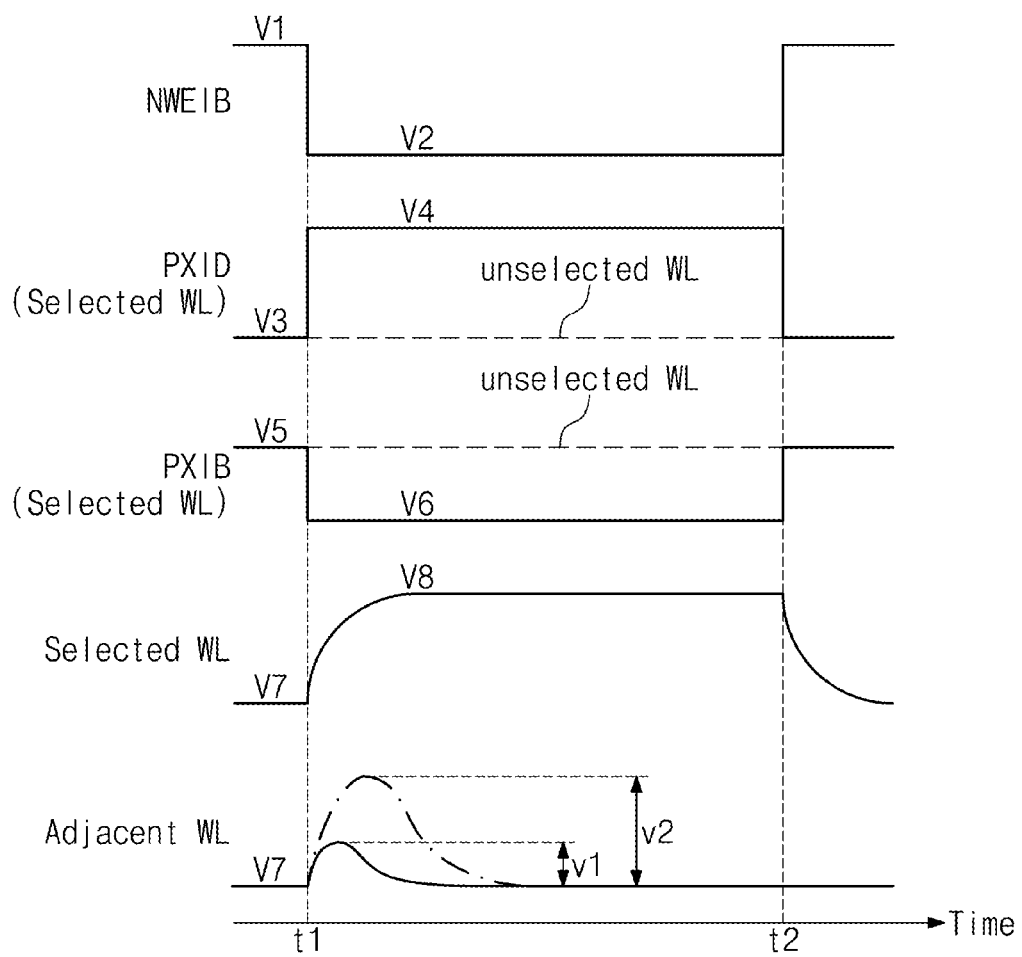
FIG. 9 is a timing diagram for describing an operation of the embodiment of FIG. 8.

FIG. 9 is a timing diagram for describing an operation of the example of FIG. 8. For brevity of drawing and for convenience of description, identification numbers for distinguishing signals are omitted. Referring to FIGS. 8 and 9, a selection word line may be enabled during a time period from a first time t1 to a second time t2. In this case, at the first time t1, the sub-word line driver enable signal NWEIB may decrease from a first voltage V1 to a second voltage V2. In an embodiment, the first voltage V1 may correspond to a voltage sufficient to turn on the NMOS transistors of the selection circuits SC1_1, SC1_3, SC2_2, and SC2_4, and the second voltage V2 may correspond to a voltage sufficient to turn off the NMOS transistors of the selection circuits SC1_1, SC1_3, SC2_2, and SC2_4.

At the first time t1, the word line selection signal PXID corresponding to the selection word line may increase from a third voltage V3 to a fourth voltage V4. In an embodiment, the third voltage V3 may have the same level as the second voltage V2. Alternatively, a difference between the second voltage V2 and the third voltage V3 may be smaller than a threshold voltage of the NMOS transistor included in each of the selection circuits SC1_1, SC1_3, SC2_2, and SC2_4. The fourth voltage V4 may correspond to the high voltage HIGH for turning on the selection transistor TR (refer to FIG. 1) of each memory cell of the memory cell array 110. That is, a selection circuit corresponding to a selection word line may provide the fourth voltage V4 (i.e., the high voltage HIGH) to the selection word line in response to the sub-word line driver enable signal NWEIB of the second voltage V2 and the word line selection signal PXID of the fourth voltage V4.

In an embodiment, the word line selection signal PXID corresponding to a non-selection word line may maintain the third voltage V3 in a word line enable period. That is, a selection circuit corresponding to a non-selection word line may be turned off in response to the sub-word line driver enable signal NWEIB of the second voltage V2 and the word line selection signal PXID of the third voltage V3.

At the first time t1, the word line non-selection signal PXIB corresponding to the selection word line may decrease from a fifth voltage V5 to a sixth voltage V6. In an embodiment, the fifth voltage V5 may correspond to a voltage for turning on the NMOS transistors of the non-selection circuits unSC1_1, unSC1_2, unSC1_3, unSC1_4, unSC2_1, unSC2_2, unSC2_3, and unSC2_4. The sixth voltage V6 may correspond to a voltage for turning off the NMOS transistors of the non-selection circuits unSC1_1, unSC1_2, unSC1_3, unSC1_4, unSC2_1, unSC2_2, unSC2_3, and unSC2_4.

In an embodiment, the word line non-selection signal PXIB corresponding to a non-selection word line may maintain the fifth voltage V5 in the word line enable period. That is, non-selection circuits unSC corresponding to a non-selection word line may be turned on in response to the word line non-selection signal PXIB of the fifth voltage V5 and thus may provide the low voltage LOW to the non-selection word line.

According to the operations of the selection circuits and the non-selection circuits responding to the above-described signals, during the word line enable period, a voltage of a selection word line may increase from a seventh voltage V7 to an eighth voltage V8. The seventh voltage V7 may correspond to the low voltage LOW for turning off a selection transistor of a memory cell, and the eighth voltage V8 may correspond to the high voltage HIGH for turning on a selection transistor of a memory cell.

A selection word line and an adjacent word line (i.e., non-selection word line) may maintain the seventh voltage V7. In this case, as described above, noise may be introduced into adjacent word lines by a voltage of a selection word line. In this case, as illustrated in FIG. 9, in a conventional memory cell array (i.e., in a structure where one end of each word line of a sub-array is floated), noise of a second magnitude v2 is introduced into adjacent word lines; on the other hand, in a memory cell array according to embodiments of the present disclosure (i.e., in a structure where opposite ends of each word line of a sub-array are connected with a sub-word line driver or in a structure where a low voltage is applied to opposite ends of each non-selection word line of a sub-array), noise of a first magnitude v1 smaller than the second magnitude v2 is introduced into adjacent word lines. That is, as a low voltage is applied from opposite ends or edges of a non-selection word line, the noise introduction occurring due to a high voltage of a selection word line may be prevented or reduced.

Figure 10:
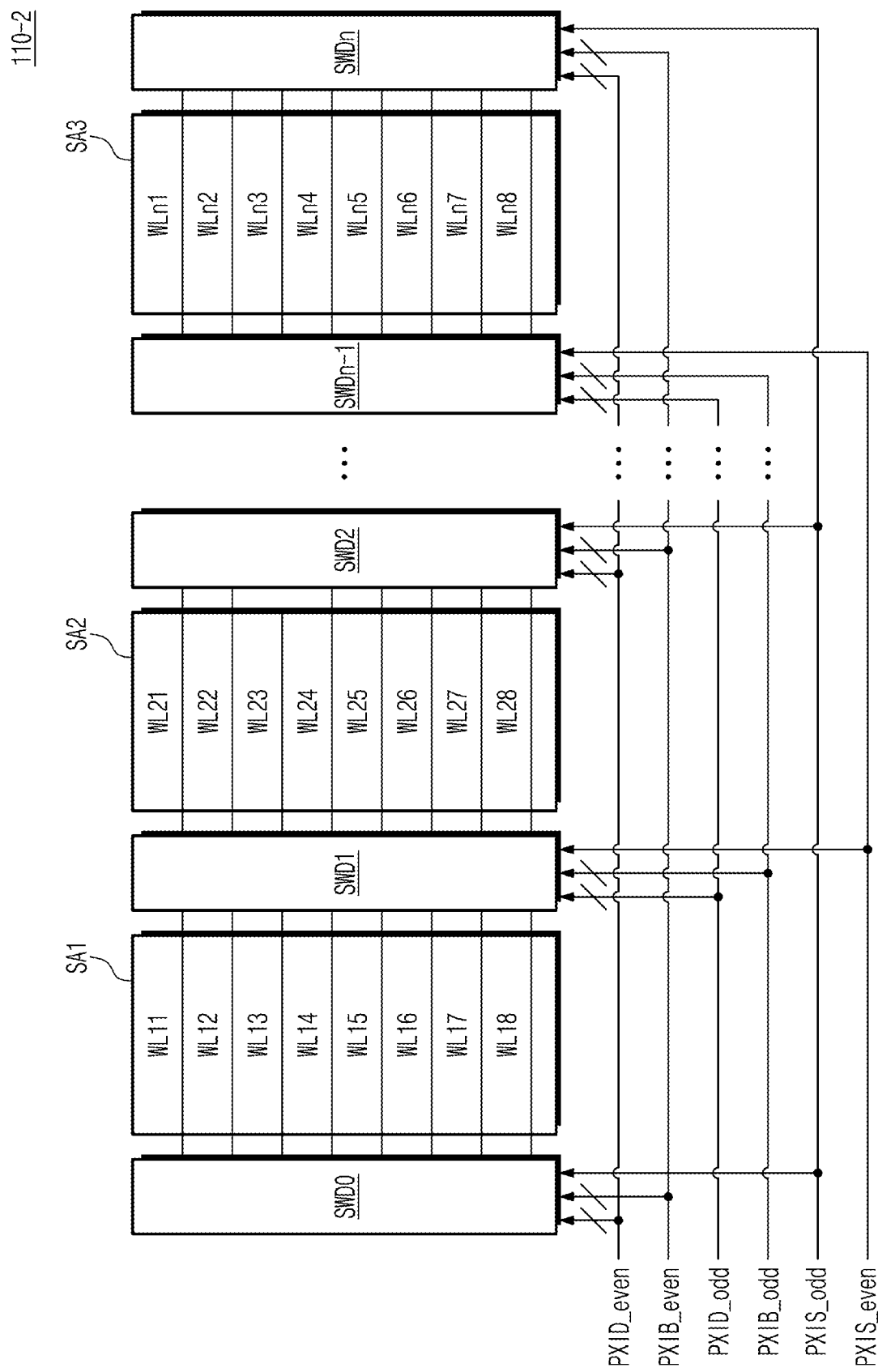
FIG. 10 is a diagram illustrating a memory cell array according to an embodiment of the present disclosure.

FIG. 10 is a diagram illustrating a memory cell array according to an embodiment of the present disclosure. For brevity of drawing and for convenience of description, the components described above are referred to by similar reference numerals, and additional description thereof may be omitted to avoid redundancy.

Referring to FIGS. 1 and 10, a memory cell array 100-2 may include a plurality of sub-arrays SA1 to SAn and a plurality of sub-word line drivers SWD0 to SWDn. The placement of the plurality of sub-arrays SA1 to SAn and the plurality of sub-word line drivers SWD0 to SWDn is similar to that described with reference to FIG. 2A, and thus, additional description may be omitted to avoid redundancy.

As illustrated in FIG. 10, the 0-th sub-word line driver SWD0 may be connected with the plurality of word lines WL11 to WL18 of the first sub-array SA1. The first sub-word line driver SWD1 may be connected with the plurality of word lines WL11 to WL18 to WL21 to WL28 of the first and second sub-arrays SA1 and SA2. The second sub-word line driver SWD2 may be connected with the plurality of word lines WL21 to WL28 of the second sub-array SA2. The (n−1)-th sub-word line driver SWDn−1 may be connected with the plurality of word lines WLn1 to WLn8 of the n-th sub-array SAn. The n-th sub-word line driver SWDn may be connected with the plurality of word lines WLn1 to WLn8 of the n-th sub-array SAn.

In the embodiment of FIG. 10, the 0-th, second, and n-th sub-word line drivers SWD0, SWD2, and SWDn may receive an even-numbered word line selection signal PXID even and an even-numbered word line non-selection signal PXIB_even. The 0-th, second, and n-th sub-word line drivers SWD0, SWD2, and SWDn may control even-numbered word lines in response to the even-numbered word line selection signal PXID even and the even-numbered word line non-selection signal PXIB_even. The 0-th, second, and n-th sub-word line drivers SWD0, SWD2, and SWDn−1 may control odd-numbered word lines in response to an odd-numbered word line supplementary signal PXIS_odd. For example, when the odd-numbered word line supplementary signal PXIS_odd indicates that all odd-numbered word lines are non-selection word lines, the 0-th, second, and n-th sub-word line drivers SWD0, SWD2, and SWDn may apply the low voltage LOW to the odd-numbered word lines.

In an embodiment, the odd-numbered word line supplementary signal PXIS_odd may be a signal indicating that odd-numbered word lines of a plurality of word lines are non-selection word lines or indicating that one of the even-numbered word lines of the plurality of word lines is a selection word line. For example, the odd-numbered word line supplementary signal PXIS_odd may be generated based on an OR operation of even-numbered word line selection signals PXID even, a NAND operation of even-numbered word line non-selection signals PXIB_even, a NOR operation of odd-numbered word line selection signals PXID odd, or an OR operation of odd-numbered word line non-selection signals PXIB_odd.

In an embodiment, the odd-numbered word line supplementary signal PXIS_odd may be generated by the X-decoder 120 or by a separate word line signal generator. Alternatively, the odd-numbered word line supplementary signal PXIS_odd may be generated by a logical operation circuit included in each of the 0-th, second, and n-th sub-word line drivers SWD0, SWD2, and SWDn, and the logical operation circuit may perform a logical operation on the above-described signals.

The first and (n−1)-th sub-word line drivers SWD1 and SWDn−1 may receive an odd-numbered word line selection signal PXID odd and an odd-numbered word line non-selection signal PXIB_odd. The first and (n−1)-th sub-word line drivers SWD1 and SWDn−1 may control odd-numbered word lines in response to the odd-numbered word line selection signal PXID odd and the odd-numbered word line non-selection signal PXIB_odd. The first and (n−1)-th sub-word line drivers SWD1 and SWDn−1 may receive an even-numbered word line supplementary signal PXIS_even. The first and (n−1)-th sub-word line drivers SWD1 and SWDn−1 may apply the low voltage LOW to even-numbered word lines in response to the even-numbered word line supplementary signal PXIS_even.

In an embodiment, the even-numbered word line supplementary signal PXIS_even may be a signal indicating that even-numbered word lines of a plurality of word lines are non-selection word lines or indicating that one of the odd-numbered word lines of the plurality of word lines is a selection word line. For example, the even-numbered word line supplementary signal PXIS_even may be generated based on an OR operation of odd-numbered word line selection signals PXID odd, a NAND operation of odd-numbered word line non-selection signals PXIB_odd, a NOR operation of even-numbered word line selection signals PXID even, or an OR operation of even-numbered word line non-selection signals PXIB_even.

In an embodiment, the even-numbered word line supplementary signal PXIS_even may be generated by the X-decoder 120 or by a separate word line signal generator. Alternatively, the even-numbered word line supplementary signal PXIS_even may be generated by a logical operation circuit included in each of the first and (n−1)-th sub-word line drivers SWD1 and SWDn−1, and the logical operation circuit may perform a logical operation on the above-described signals.

Figure 11:
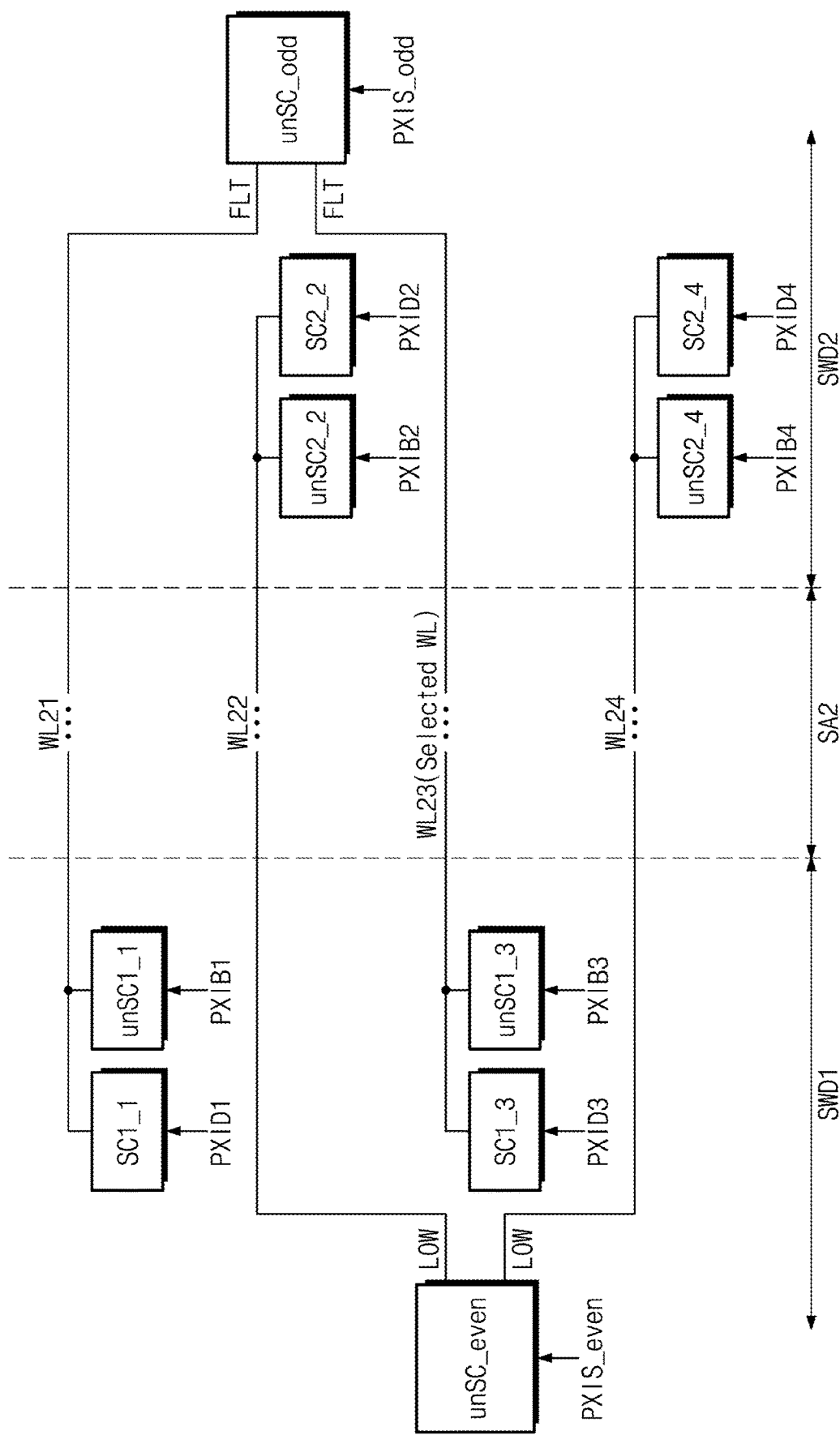
FIG. 11 is a diagram illustrating first and second sub-word line drivers of FIG. 10.

FIG. 11 is a diagram illustrating first and second sub-word line drivers of FIG. 10. Referring to FIGS. 10 and 11, the first sub-word line driver SWD1 may include the selection circuit SC1_1 and the non-selection circuit unSC1_1 connected with the first word line WL21, and the selection circuit SC1_3 and the non-selection circuit unSC1_3 connected with the third word line WL23. The second sub-word line driver SWD2 may include the selection circuit SC2_2 and the non-selection circuit unSC2_2 connected with the second word line WL22, and the selection circuit SC2_4 and the non-selection circuit unSC2_4 connected with the fourth word line WL24. The above components may operate in response to the word line selection signals PXID1 to PXID4 and the word line non-selection signals PXIB1 to PXIB4, and the operations of the above components are similar to those described above. Thus, additional description may be omitted to avoid redundancy.

The first sub-word line driver SWD1 may further include an even-numbered word line non-selection circuit unSC_even. The even-numbered word line non-selection circuit unSC_even may selectively apply the low voltage LOW to the second and fourth word lines WL22 and WL24 (i.e., even-numbered word lines) in response to the even-numbered word line supplementary signal PXIS_even. For example, as described above, the even-numbered word line supplementary signal PXIS_even may be a signal indicating that all even-numbered word lines are non-selection word lines or that a selection word line is one of the odd-numbered word lines. As illustrated in FIG. 11, when the third word line WL23 (or an odd-numbered word line) is a selection word line, the even-numbered word line non-selection circuit unSC_even may apply the low voltage LOW to the second and fourth word lines WL22 and WL24 (i.e., even-numbered word lines) in response to the even-numbered word line supplementary signal PXIS_even.

The second sub-word line driver SWD2 may further include an odd-numbered word line non-selection circuit unSC_odd. The odd-numbered word line non-selection circuit unSC_odd may selectively apply the low voltage LOW to the first and third word lines WL11 and WL13 (i.e., odd-numbered word lines) in response to the odd-numbered word line supplementary signal PXIS_odd. For example, as described above, the odd-numbered word line supplementary signal PXIS_odd may be a signal indicating that all odd-numbered word lines are non-selection word lines or that a selection word line is one of the even-numbered word lines. As illustrated in FIG. 11, when the third word line WL23 (or an odd-numbered word line) is a selection word line, the odd-numbered word line non-selection circuit unSC_odd may float FLT the first and third word lines WL21 and WL23 (i.e., odd-numbered word lines) in response to the odd-numbered word line supplementary signal PXIS_odd. Because one of the odd-numbered word lines is a selection word line and the selection word line of the odd-numbered word lines is controlled to the high voltage HIGH by the first sub-word line driver SWD1, to maintain a level of the selection word line (i.e., odd-numbered word line), the odd-numbered word line non-selection circuit unSC_odd may float the odd-numbered word lines WL21 and WL23.

In an embodiment, as illustrated in FIG. 11, when the third word line WL23 is a selection word line, the first sub-word line driver SWD1 may apply the high voltage HIGH to the third word line WL23 and may apply the low voltage LOW to the second and fourth word lines WL22 and WL24. In this case, because the second and fourth word lines WL22 and WL24 adjacent to the third word line WL23 being a selection word line are maintained at the low voltage LOW in a region adjacent to the first sub-word line driver SWD1, noise that is introduced into the second and fourth word lines WL22 and WL24 due to the word line coupling may be blocked.

Figure 12:
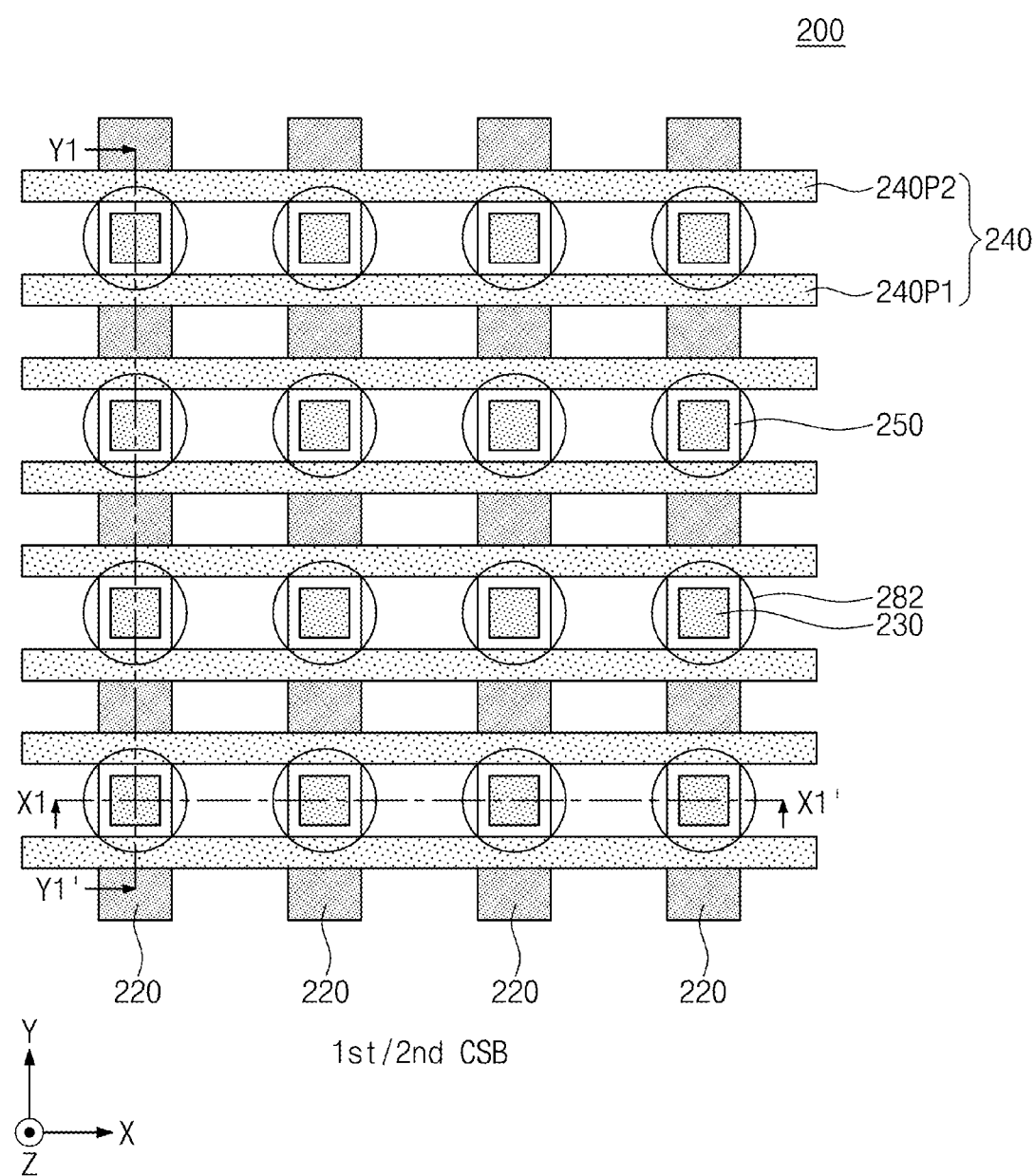
FIG. 12 is a layout illustrating an integrated circuit device according to an embodiment of the present disclosure.
Figure 13:
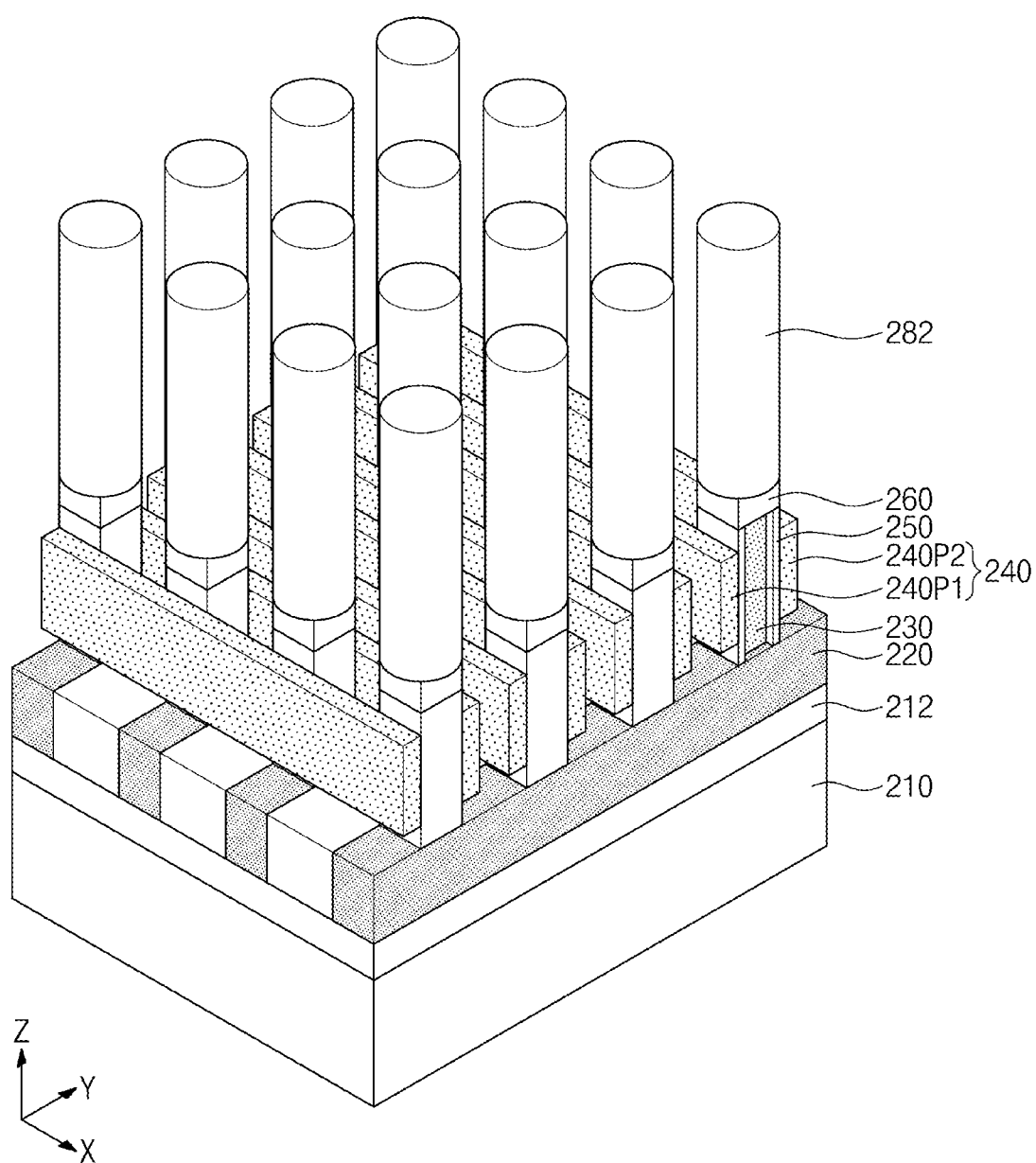
FIG. 13 is a perspective view illustrating an integrated circuit device.
Figure 14:
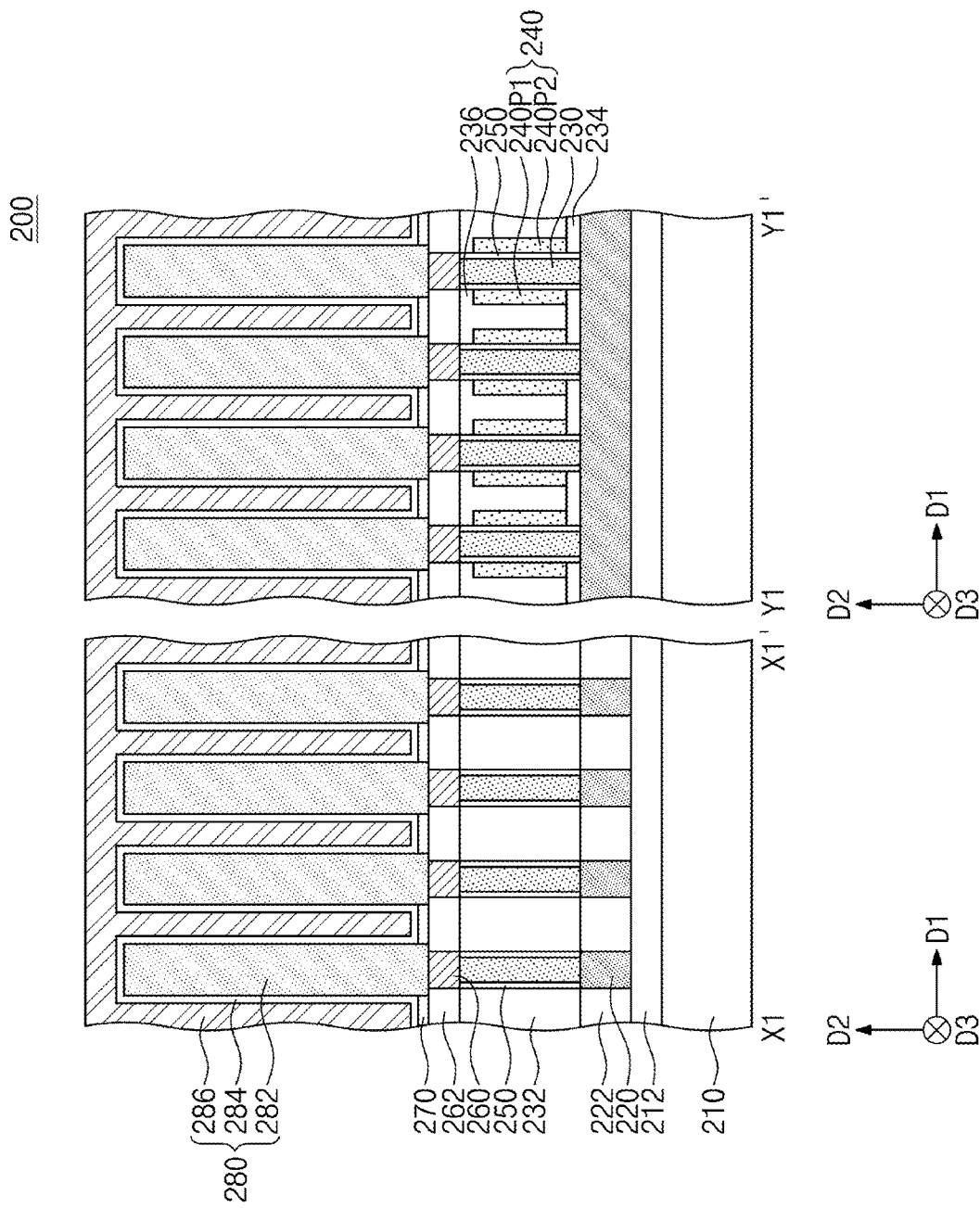
FIG. 14 is a cross-sectional view of an integrated circuit device taken along line X1-X1' and line Y1-Y1' of FIG. 12.

FIG. 12 is a layout illustrating an integrated circuit device 200 according to an embodiment of the present disclosure, FIG. 13 is a perspective view illustrating the integrated circuit device 200, and FIG. 14 is a cross-sectional view of the integrated circuit device 200 taken along line X1-X1' and line Y1-Y1' of FIG. 12.

In an embodiment, the memory device 100 described with reference to FIGS. 1 to 11 may be replaced with the integrated circuit device 200 to be described with reference to the following drawings. That is, the plurality of memory cells included in the memory device 100 may have a structure of a memory cell to be described with reference to the following drawings (or a structure including a vertical channel transistor (VCT)). The integrated circuit device 200 may include the sub-word line drivers described with reference to FIGS. 1 to 11.

Referring to FIGS. 12 to 14, the integrated circuit device 200 may include a substrate 210, a plurality of first conductive lines 220, a channel layer 230, a gate electrode 240, a gate insulating layer 250, and a capacitor structure 280. The integrated circuit device 200 may be a memory device including a vertical channel transistor (VCT). The vertical channel transistor may have a structure in which a channel length of the channel layer 230 extends along a vertical direction from the substrate 210.

A lower insulating layer 212 may be disposed on the substrate 210, and the plurality of first conductive lines 220 may be disposed on the lower insulating layer 212 to be spaced from each other in a first direction (i.e., an X-direction) and to extend in a second direction (i.e., a Y-direction). A plurality of first insulating patterns 222 may be disposed on the lower insulating layer 212 to fill spaces between the plurality of first conductive lines 220. The plurality of first insulating patterns 222 may extend in the second direction (i.e., Y-direction), and upper surfaces of the plurality of first insulating patterns 222 may be disposed at the same level as upper surfaces of the plurality of first conductive lines 220. The plurality of first conductive lines 220 may function as bit lines of the integrated circuit device 200.

In some embodiments, the plurality of first conductive lines 220 may include doped polysilicon, metal, conductive metal nitride, conductive metal silicide, conductive metal oxide, or a combination thereof. For example, the plurality of first conductive lines 220 may be doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but is not limited thereto. The plurality of first conductive lines 220 may include a single layer or multiple layers formed of the materials described above. In some embodiments, the plurality of first conductive lines 220 may include a two-dimensional semiconductor material, and, for example, the two-dimensional semiconductor material may include graphene, carbon nanotube, or a combination thereof.

The channel layers 230 may be arranged on the plurality of first conductive lines 220 in a matrix form so as to be spaced from each other in the first direction (i.e., X-direction) and the second direction (i.e., Y-direction). The channel layer 230 may have a first width in the first direction (i.e., X-direction), may have a first height in a third direction (i.e., Z-direction), and the first height may be greater than the first width. For example, the first height may be about 2 to 10 times the first width, but is not limited thereto. A bottom portion of the channel layer 230 may function as a first source/drain region (not illustrated), an upper portion of the channel layer 230 may function as a second source/drain region (not illustrated), and a portion of the channel layer 230 between the first and second source/drain regions may function as a channel region (not illustrated).

In some embodiments, the channel layer 230 may include an oxide semiconductor. For example, the oxide semiconductor may include InxGayZnzO, InxGaySizO, InxSnyZnzO, InxZnyO, ZnxO, ZnxSnyO, ZnxOyN, ZrxZnySnzO, SnxO, HfxInyZOnzO, AlxGaySnz, or InxGaySnzO, GaxGaySnz, or a combination thereof. The channel layer 230 may include a single layer or multiple layers formed of the oxide semiconductor. In some embodiments, the channel layer 230 may have bandgap energy greater than bandgap energy of silicon. For example, the channel layer 230 may have a bandgap energy of about 1.5 eV to 5.6 eV. For example, when the channel layer 230 has the bandgap energy of about 2.0 eV to 4.0 eV, the channel layer 230 may have improved/optimum channel performance. For example, the channel layer 230 may be polycrystalline or amorphous, but is not limited thereto. In some embodiments, the channel layer 230 may include a two-dimensional semiconductor material, and, for example, the two-dimensional semiconductor material may include graphene, carbon nanotube, or a combination thereof.

The gate electrode 240 may extend in the first direction (i.e., X-direction) on opposite side walls of the channel layer 230. The gate electrode 240 may include a first sub-gate electrode 240P1 facing a first side wall of the channel layer 230, and a second sub-gate electrode 240P2 facing a second side wall of the channel layer 230, which is opposite to the first side wall. As one channel layer 230 is interposed between the first sub-gate electrode 240P1 and the second sub-gate electrode 240P2, the integrated circuit device 200 may have a dual-gate transistor structure. However, the present disclosure is not limited thereto. For example, a single-gate transistor structure may be implemented by omitting the second sub-gate electrode 240P2 and forming only the first sub-gate electrode 240P1 facing the first side wall of the channel layer 230.

The gate electrode 240 may include doped polysilicon, metal, conductive metal nitride, conductive metal silicide, conductive metal oxide, or a combination thereof. For example, the gate electrode 240 may be doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but is not limited thereto.

The gate insulating layer 250 may surround the side wall of the channel layer 230 and may be interposed between the channel layer 230 and the gate electrode 240. For example, as illustrated in FIG. 12, the whole side wall of the channel layer 230 may be surrounded by the gate insulating layer 250, and a portion of the side wall of the gate electrode 240 may be in contact with the gate insulating layer 250. In other embodiments, the gate insulating layer 250 may extend in an extending direction of the gate electrode 240 (i.e., the first direction (i.e., X-direction)), and only two side walls facing the gate electrode 240 from among side walls of the channel layer 230 may be in contact with the gate insulating layer 250.

In some embodiments, the gate insulating layer 250 may be formed of a silicon oxide layer, a silicon oxynitride layer, a high-k dielectric layer whose dielectric constant is higher than that of the silicon oxide layer, or a combination thereof. The high-k dielectric layer may be formed of metal oxide or metal oxynitride. For example, the high-k dielectric layer that is available as the gate insulating layer 250 may be formed of $HfO_2$, HfSiO, HfSiON, HfTaO, HfSiO, HfZrO, $ZrO_2$, $Al_2O_3$, or a combination thereof, but is not limited thereto.

A plurality of second insulating patterns 232 may extend along the second direction (i.e., Y-direction) on the plurality of first insulating patterns 222, and the channel layer 230 may be disposed between two second insulating patterns 232 adjacent to each other from among the plurality of second insulating patterns 232. Also, between the two second insulating patterns 232 adjacent to each other, a first buried layer 234 and a second buried layer 236 may be disposed in a space between two adjacent channel layers 230. The first buried layer 234 may be disposed at a bottom portion of the space between the two adjacent channel layers 230, and the second buried layer 236 may be formed on the first buried layer 234 to fill the remaining space between the two adjacent channel layers 230. An upper surface of the second buried layer 236 may be disposed at the same level as an upper surface of the channel layer 230, and the second buried layer 236 may cover an upper surface of the gate electrode 240. Unlike the above description, the plurality of second insulating patterns 232 may be formed of a material layer continuous to the plurality of first insulating patterns 222, or the second buried layer 236 may be formed of a material layer continuous to the first buried layer 234.

A capacitor contact 260 may be disposed on each channel layer 230. The capacitor contacts 260 may be disposed to vertically overlap the channel layers 230, and may be arranged in a matrix form so as to be spaced from each other in the first direction (i.e., X-direction) and the second direction (i.e., Y-direction). The capacitor contact 260 may be doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but is not limited thereto. An upper insulating layer 262 may surround side walls of the capacitor contacts 260 on the plurality of second insulating patterns 232 and the second buried layer 236.

An etch-stop layer 270 may be disposed on the upper insulating layer 262, and the capacitor structure 280 may be disposed on the etch-stop layer 270. The capacitor structure 280 may include a lower electrode 282, a capacitor dielectric layer 284, and an upper electrode 286.

The lower electrode 282 may be electrically connected with an upper surface of the capacitor contact 260 through the etch-stop layer 270. The lower electrode 282 may be formed in the shape of a pillar extending in the third direction (i.e., Z-direction), but is not limited thereto. In some embodiments, the lower electrodes 282 may be disposed to vertically overlap the capacitor contacts 260, and may be arranged in a matrix form so as to be spaced from each other in the first direction (i.e., X-direction) and the second direction (i.e., Y-direction). Unlike the above description, a landing pad (not illustrated) may be further disposed between the capacitor contact 260 and the lower electrode 282 such that the lower electrodes 282 are arranged in a hexagonal shape.

Figure 15:
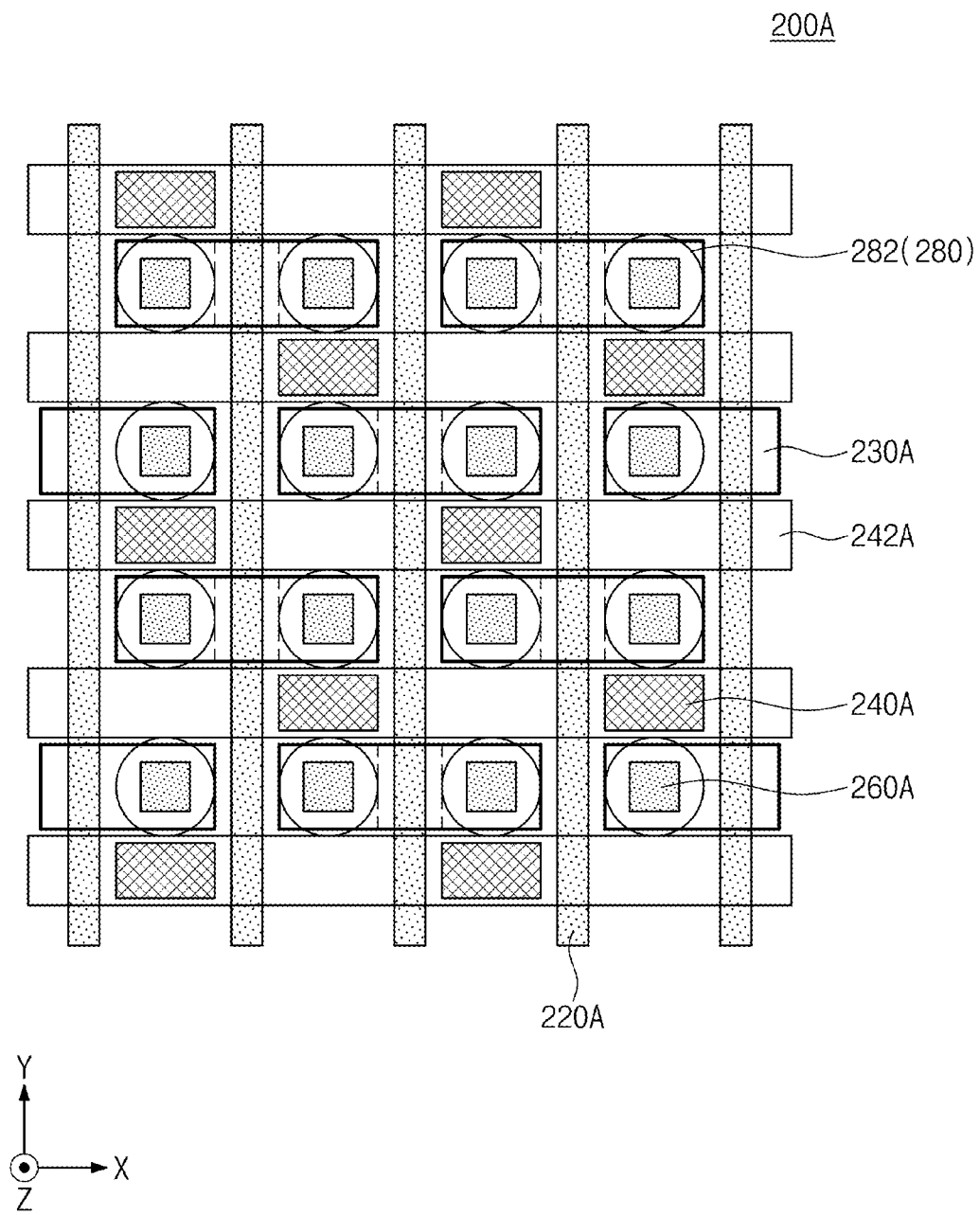
FIG. 15 is a layout illustrating an integrated circuit device according to some embodiments.
Figure 16:
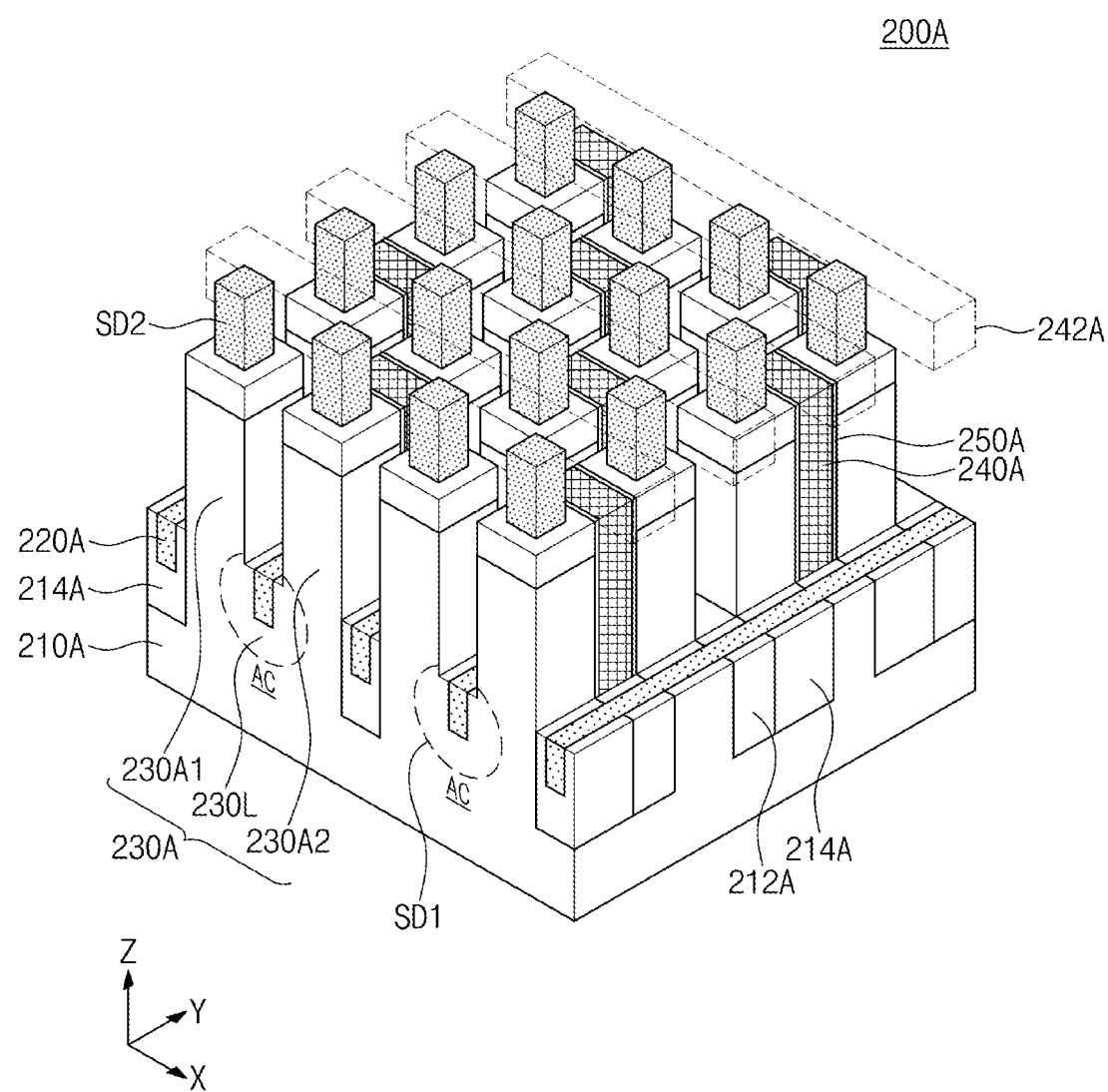
FIG. 16 is a perspective view illustrating an integrated circuit device.

FIG. 15 is a layout illustrating an integrated circuit device 200A according to some embodiments, and FIG. 16 is a perspective view illustrating the integrated circuit device 200A.

Referring to FIGS. 15 and 16, the integrated circuit device 200A may include a substrate 210A, a plurality of first conductive lines 220A, a channel structure 230A, a contact gate electrode 240A, a plurality of second conductive lines 242A, and the capacitor structure 280. The integrated circuit device 200A may be a memory device including a vertical channel transistor (VCT).

A plurality of active regions AC may be defined in the substrate 210A by a first device isolation layer 212A and a second device isolation layer 214A. The channel structure 230A may be disposed in each active region AC, and the channel structure 230A may include a first active pillar 230A1 and a second active pillar 230A2 extending in a vertical direction, and a connecting part 230L connected with a bottom portion of the first active pillar 230A1 and a bottom portion of the second active pillar 230A2. A first source/drain region SD1 may be disposed in the connecting part 230L, and a second source/drain region SD2 may be disposed on an upper side of the first and second active pillar 230A1 and 230A2. Each of the first active pillar 230A1 and the second active pillar 230A2 may constitute an independent unit memory cell.

The plurality of first conductive lines 220A may extend in a direction intersecting each of the plurality of active regions AC. For example, the plurality of first conductive lines 220A may extend in the second direction (i.e., Y-direction). One first conductive line 220A of the plurality of first conductive lines 220A may be disposed on the connecting part 230L between the first active pillar 230A1 and the second active pillar 230A2, and the one first conductive line 220A may be disposed on the first source/drain region SD1. Another first conductive line 220A adjacent to the one first conductive line 220A may be disposed between two channel structures 230A. One first conductive line 220A of the plurality of first conductive lines 220A may function as a common bit line associated with 2 unit memory cells that the first active pillar 230A1 and the second active pillar 230A2 disposed on opposite sides of the one first conductive line 220A constitute.

One contact gate electrode 240A may be disposed between two channel structures 230A adjacent in the second direction (i.e., Y-direction). For example, the contact gate electrode 240A may be disposed between the first active pillar 230A1 included in one channel structure 230A and the second active pillar 230A2 of a channel structure 230A adjacent to the one channel structure 230A, and may be shared by the first active pillar 230A1 and the second active pillar 230A2 disposed on opposite side walls thereof. The gate insulating layer 250A may be disposed between the contact gate electrode 240A and the first active pillar 230A1 and between the contact gate electrode 240A and the second active pillar 230A2. The plurality of second conductive lines 242A may extend in the first direction (i.e., X-direction) on the contact gate electrode 240A. The plurality of second conductive lines 242A may function as word lines of the integrated circuit device 200A.

A capacitor contact 260A may be disposed on the channel structure 230A. The capacitor contact 260A may be disposed on the second source/drain region SD2, and the capacitor structure 280 may be disposed on the capacitor contact 260A.

According to the present disclosure, a memory device may apply a low voltage to edges (or ends) of non-selection word lines of a sub-array. In this case, noise generation or noise introduction due to coupling between a selection word line and an adjacent non-selection word line may be reduced. Accordingly, a memory device with improved reliability is provided.

While the present disclosure has been described with reference to embodiments thereof, it will be apparent to those of ordinary skill in the art that various changes and modifications may be made thereto without departing from the scope of the present disclosure as set forth in the following claims.

What is claimed is:

1. A memory device comprising:
    a row decoder configured to generate a plurality of word line control signals, based on a row address received from an external device;
    a first sub-array including a plurality of memory cells connected with a plurality of word lines;
    a first sub-word line driver configured to provide a selection voltage or a non-selection voltage to odd-numbered word lines of the plurality of word lines, based on odd-numbered word line control signals corresponding to the odd-numbered word lines; and
    a second sub-word line driver configured to provide the selection voltage or the non-selection voltage to even-numbered word lines of the plurality of word lines, based on even-numbered word line control signals corresponding to the even-numbered word lines,
    wherein the first sub-word line driver is further configured to apply the non-selection voltage to non-selection word lines of the even-numbered word lines, in response to the even-numbered word line control signals, and
    wherein the second sub-word line driver is further configured to apply the non-selection voltage to non-selection word lines of the odd-numbered word lines, in response to the odd-numbered word line control signals.

2. The memory device of claim 1, wherein the odd-numbered word lines alternate with the even-numbered word lines in the first sub-array.

3. The memory device of claim 1,
    wherein the plurality of word lines extend along a first direction,
    wherein the first sub-word line driver, the first sub-array, and the second sub-word line driver are arranged along the first direction,
    wherein the first sub-array is between the first sub-word line driver and the second sub-word line driver,
    wherein the first sub-word line driver is connected to respective first ends of the plurality of word lines, and
    wherein the second sub-word line driver is connected to respective second ends of the plurality of word lines that are opposite the first ends.

4. The memory device of claim 1,
    wherein the first sub-word line driver includes:
        a plurality of odd-numbered main driving circuits configured to apply the selection voltage or the non-selection voltage to the odd-numbered word lines in response to the odd-numbered word line control signals; and
        a plurality of even-numbered supplementary driving circuits configured to selectively apply the non-selection voltage to the even-numbered word lines in response to the even-numbered word line control signals, and
    wherein the second sub-word line driver includes:
        a plurality of even-numbered main driving circuits configured to apply the selection voltage or the non-selection voltage to the even-numbered word lines in response to the even-numbered word line control signals; and
        a plurality of odd-numbered supplementary driving circuits configured to selectively apply the non-selection voltage to the odd-numbered word lines in response to the odd-numbered word line control signals.

5. The memory device of claim 4,
    wherein each of the plurality of odd-numbered main driving circuits includes:
        an odd-numbered selection circuit connected to one corresponding word line of the odd-numbered word lines, and configured to selectively apply the selection voltage to the one corresponding word line in response to one of the odd-numbered word line control signals; and
        an odd-numbered non-selection circuit connected to the one corresponding word line of the odd-numbered word lines, and configured to selectively apply the non-selection voltage to the one corresponding word line in response to the one of the odd-numbered word line control signals, and
    wherein each of the plurality of even-numbered supplementary driving circuits includes:
        an even-numbered selection circuit connected to one corresponding word line of the even-numbered word lines, and configured to selectively apply the non-selection voltage to the one corresponding word line of the even-numbered word lines in response to one of the even-numbered word line control signals.

6. The memory device of claim 1, wherein each of the plurality of memory cells includes:
    a selection transistor configured to operate in response to a corresponding word line of the plurality of word lines; and
    a storage capacitor connected to the selection transistor.

7. The memory device of claim 6, wherein the selection transistor includes a vertical channel transistor (VCT).

8. A memory device comprising:
a row decoder configured to generate a first word line selection signal, a first word line non-selection signal, a second word line selection signal, and a second word line non-selection signal, based on a row address received from an external device;
a first sub-array including a plurality of first memory cells connected to a first word line and a plurality of second memory cells connected to a second word line;
a first sub-word line driver connected to the first word line, and configured to apply a selection voltage to the first word line in response to the first word line selection signal and to apply a non-selection voltage to the first word line in response to the first word line non-selection signal; and
a second sub-word line driver connected to the second word line, and configured to apply the selection voltage to the second word line in response to the second word line selection signal and to apply the non-selection voltage to the second word line in response to the second word line non-selection signal,
wherein the first sub-word line driver is connected to the second word line and is further configured to apply the non-selection voltage to the second word line in response to the second word line non-selection signal, and
wherein the second sub-word line driver is connected to the first word line and is further configured to apply the non-selection voltage to the first word line in response to the first word line non-selection signal.

9. The memory device of claim 8, wherein the first sub-array is between the first sub-word line driver and the second sub-word line driver.

10. The memory device of claim 8,
wherein each of the first word line and the second word line extends along a first direction, and
wherein the first word line and the second word line are physically adjacent to each other along a second direction perpendicular to the first direction.

11. The memory device of claim 8,
wherein, when the first word line is a selection word line, the first sub-word line driver is configured to apply the selection voltage to the first word line and apply the non-selection voltage to the second word line, and the second sub-word line driver is configured to float the first word line and apply the non-selection voltage to the second word line, and
wherein, when the second word line is a selection word line, the first sub-word line driver is configured to apply the non-selection voltage to the first word line and float the second word line, and the second sub-word line driver is configured to apply the non-selection voltage to the first word line and apply the selection voltage to the second word line.

12. The memory device of claim 8, wherein the first and second sub-word line drivers are configured to operate in response to a sub-word line driver enable signal.

13. The memory device of claim 12,
wherein the first sub-word line driver includes:
a first selection circuit configured to apply the selection voltage to the first word line in response to the first word line selection signal and the sub-word line driver enable signal;
a first non-selection circuit configured to apply the non-selection voltage to the first word line in response to the first word line non-selection signal; and
a second non-selection circuit configured to apply the non-selection voltage to the second word line in response to the second word line non-selection signal, and
wherein the second sub-word line driver includes:
a third non-selection circuit configured to apply the non-selection voltage to the first word line in response to the first word line non-selection signal;
a second selection circuit configured to apply the selection voltage to the second word line in response to the second word line selection signal and the sub-word line driver enable signal; and
a fourth non-selection circuit configured to apply the non-selection voltage to the second word line in response to the second word line non-selection signal.

14. The memory device of claim 13,
wherein the first selection circuit includes:
a first PMOS transistor connected between a first input terminal that is configured to receive the first word line selection signal and the first word line, the first PMOS transistor being configured to operate in response to the sub-word line driver enable signal; and
a first NMOS transistor connected between the first word line and a low voltage terminal that is configured to receive the non-selection voltage, the first NMOS transistor being configured to operate in response to the sub-word line driver enable signal, and
wherein the second selection circuit includes:
a second PMOS transistor connected between a second input terminal that is configured to receive the second word line selection signal and the second word line, the second PMOS transistor being configured to operate in response to the sub-word line driver enable signal; and
a second NMOS transistor connected between the second word line and the low voltage terminal, and configured to operate in response to the sub-word line driver enable signal.

15. The memory device of claim 13,
wherein the first non-selection circuit includes a third NMOS transistor connected between the first word line and a low voltage terminal that is configured to receive the non-selection voltage, the third NMOS transistor being configured to operate in response to the first word line non-selection signal,
wherein the second non-selection circuit includes a fourth NMOS transistor connected between the second word line and the low voltage terminal, and configured to operate in response to the second word line non-selection signal,
wherein the third non-selection circuit includes a fifth NMOS transistor connected between the first word line and the low voltage terminal, and configured to operate in response to the first word line non-selection signal, and
wherein the fourth non-selection circuit includes a sixth NMOS transistor connected between the second word line and the low voltage terminal, and configured to operate in response to the second word line non-selection signal.

16. The memory device of claim 8, further comprising:
a second sub-array including a plurality of third memory cells connected to a third word line and a plurality of fourth memory cells connected to a fourth word line,
wherein the second sub-word line driver is connected to the fourth word line and is further configured to apply the selection voltage to the fourth word line in response to the second word line selection signal and to apply the non-selection voltage to the fourth word line in response to the second word line non-selection signal, and
wherein the second sub-word line driver is connected to the third word line and is further configured to apply the non-selection voltage to the third word line in response to the first word line non-selection signal.

17. The memory device of claim 16, wherein the second sub-word line driver includes:
a first non-selection circuit configured to apply the non-selection voltage to the first word line in response to the first word line non-selection signal;
a second selection circuit configured to apply the selection voltage to the second and fourth word lines in response to the second word line selection signal;
a second non-selection circuit configured to apply the non-selection voltage to the second and fourth word lines in response to the second word line non-selection signal; and
a third non-selection circuit configured to apply the non-selection voltage to the third word line in response to the first word line non-selection signal.

18. The memory device of claim 17, wherein the first word line and the third word line are in a first row, and the second word line and the fourth word line are in a second row.

19. A memory device comprising:
a first memory cell including a storage capacitor, and a selection transistor connected between the storage capacitor and a first word line;
a first sub-word line driver connected to a first end of the first word line, and configured to apply one of a selection voltage and a non-selection voltage to the first word line in response to a first word line control signal; and
a second sub-word line driver connected to a second end of the first word line,
wherein, in response to the first word line control signal, the second sub-word line driver is configured to float the first word line or to apply the non-selection voltage to the first word line.

20. The memory device of claim 19,
wherein, when the first word line control signal indicates that the first word line is a selection word line, the first sub-word line driver is configured to apply the selection voltage through the first end of the first word line, and the second sub-word line driver is configured to float the second end of the first word line, and
wherein, when the first word line control signal indicates that the first word line is a non-selection word line, the first sub-word line driver is configured to apply the non-selection voltage through the first end of the first word line, and the second sub-word line driver is configured to apply the non-selection voltage through the second end of the first word line.

* * * * *